(12) United States Patent
He

(10) Patent No.: US 12,211,566 B2
(45) Date of Patent: Jan. 28, 2025

(54) DOUBLE PROGRAM DEBUG METHOD FOR NAND MEMORY USING SELF-VERIFICATION BY INTERNAL FIRMWARE

(71) Applicant: YANGTZE MEMORY TECHNOLOGIES CO., LTD., Wuhan (CN)

(72) Inventor: Youxin He, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 0 days.

(21) Appl. No.: 18/533,007

(22) Filed: Dec. 7, 2023

(65) Prior Publication Data

US 2024/0105273 A1   Mar. 28, 2024

Related U.S. Application Data

(63) Continuation of application No. 17/704,956, filed on Mar. 25, 2022, now Pat. No. 11,887,678, which is a continuation of application No. PCT/CN2022/072451, filed on Jan. 18, 2022.

(51) Int. Cl.
| | |
|---|---|
| *G11C 16/34* | (2006.01) |
| *G11C 16/08* | (2006.01) |
| *G11C 16/10* | (2006.01) |
| *G11C 16/26* | (2006.01) |
| *G11C 16/32* | (2006.01) |

(52) U.S. Cl.
CPC .......... *G11C 16/3459* (2013.01); *G11C 16/08* (2013.01); *G11C 16/102* (2013.01); *G11C 16/26* (2013.01); *G11C 16/32* (2013.01)

(58) Field of Classification Search
CPC .................................................. G11C 16/3459
See application file for complete search history.

(56) References Cited

U.S. PATENT DOCUMENTS

| | | | |
|---|---|---|---|
| 11,189,326 B1 | 11/2021 | Guo | |
| 2016/0093384 A1 | 3/2016 | Lee | |
| 2016/0231953 A1 | 8/2016 | Lee et al. | |
| 2017/0242632 A1* | 8/2017 | Cho | G06F 3/0655 |
| 2018/0046582 A1 | 2/2018 | Pedersen et al. | |

(Continued)

FOREIGN PATENT DOCUMENTS

| | | |
|---|---|---|
| CN | 113692623 A | 11/2021 |
| KR | 20160096969 A | 8/2016 |
| KR | 20210033713 A | 3/2021 |

OTHER PUBLICATIONS

International Search Report issued in corresponding International Application No. PCT/CN2022/072451, mailed Oct. 10, 2022, 5 pages.

*Primary Examiner* — Jason Lappas
(74) *Attorney, Agent, or Firm* — BAYES PLLC

(57) ABSTRACT

The present disclosure provides a method for programing flash memory devices. The method may include programming a selected page of the NAND flash memory device according to programming data. The selected page may include memory cells corresponding to a word line. The programming of the selected page may include programming operations with programming voltages applied on the word line and a read operation performed on the selected page.

20 Claims, 17 Drawing Sheets

(56) References Cited

U.S. PATENT DOCUMENTS

| | | |
|---|---|---|
| 2018/0182463 A1 | 6/2018 | Dutta et al. |
| 2021/0090660 A1 | 3/2021 | Kim |
| 2021/0255787 A1 | 8/2021 | Cheng |
| 2021/0303203 A1 | 9/2021 | Eliash et al. |
| 2023/0004297 A1 | 1/2023 | Wan et al. |

* cited by examiner

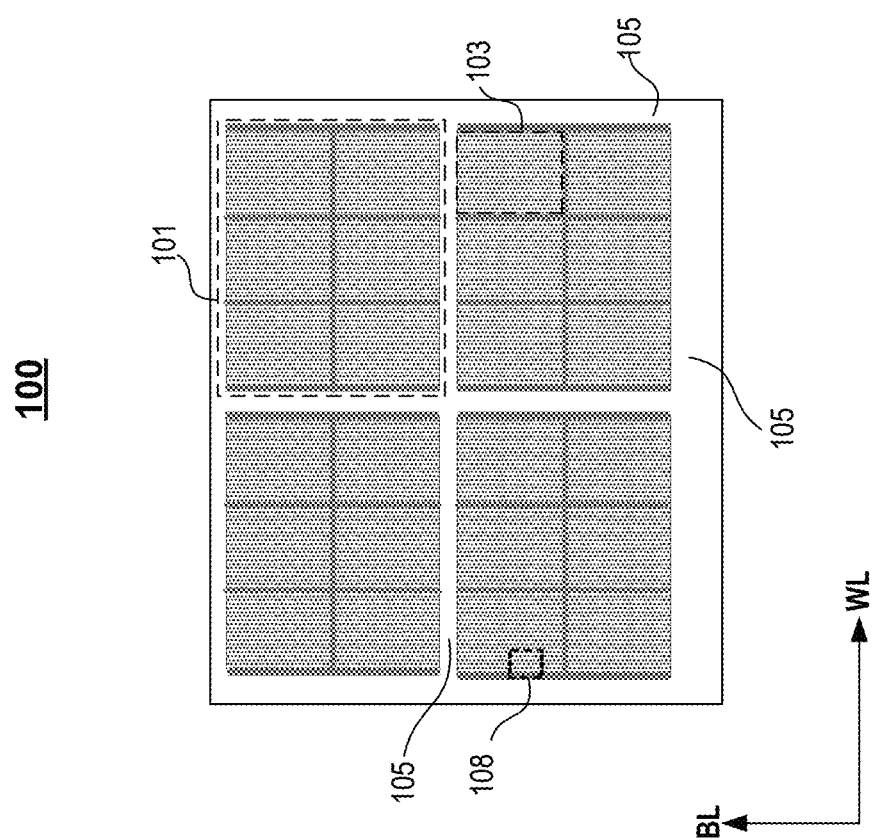

DOUBLE PROGRAM DEBUG METHOD FOR NAND MEMORY USING SELF-VERIFICATION BY INTERNAL FIRMWARE

CROSS REFERENCE TO RELATED APPLICATIONS

This application is a continuation of U.S. application Ser. No. 17/704,956, filed on Mar. 25, 2022, which is a continuation of International Application No. PCT/CN2022/072451, filed on Jan. 18, 2022, both of which are incorporated herein by reference in their entireties.

TECHNICAL FIELD

The present disclosure generally relates to the field of semiconductor technology, and more particularly, to a method for debugging double program errors in NAND memory.

BACKGROUND

As memory devices are shrinking to smaller die size to reduce manufacturing cost and increase storage density, scaling of planar memory cells faces challenges due to process technology limitations and reliability issues. A three-dimensional (3D) memory architecture can address the density and performance limitation in planar memory cells.

In a 3D NAND flash memory, many layers of memory cells can be stacked vertically such that storage density per unit area can be greatly increased. The vertically stacked memory cells can form memory strings, where the channels of the memory cells are connected in each memory string. Each memory cell can be addressed through a word line and a bit line. Data (i.e., logic states) of the memory cells in an entire memory page sharing the same word line can be read or programmed simultaneously. However, due to aggressive scaling, reliability can be a concern for a 3D NAND flash memory.

BRIEF SUMMARY

Embodiments of methods and systems for data protection in a memory device are described in the present disclosure.

In some embodiments, a programming method can provide a method for enhancing debugging of flash memory devices using NAND self-verification. The programming method can include programming a selected page of the NAND flash memory device according to first and second programming data. The selected page can include a plurality of memory cells corresponding to a word line. The programming of the selected page can include a plurality of programming operations using a plurality of programming voltages. The programming of the selected page can also include a plurality of verifying operations. Ones of the plurality of verifying operations can be performed after corresponding ones of the plurality of programming operations to determine whether programmed memory cells of the selected page have threshold voltage levels according to the first or second programming data. The programming method can also include performing a self-verification on the selected page to determine whether data stored at the selected page was overwritten. The programming method can also include generating a fail indication upon determining that the data stored at the selected page was overwritten.

In some embodiments, the programming of the selected page can be associated with a memory controller-implemented program of the NAND flash memory device. The programming method can also include stopping the memory controller-implemented program in response to the generating of the fail indication. The programming method can also include debugging the memory controller-implemented program based on a timing of the stopping of the memory controller-implemented program.

In some embodiments, the self-verification can include performing an internal read operation on the selected page by the NAND flash memory device to determine the data stored at the selected page.

In some embodiments, the programming method can also include comparing data determined from the internal read operation on the selected page and the first or second programming data. The generating of the fail indication can include determining, based on the comparing, a fail result if a failed-bit count is above a threshold.

In some embodiments, the programming method can also include receiving, by the NAND memory, an input to adjust the performing of the self-verification.

In some embodiments, the programming method can also include limiting the performing of the self-verification to one or more regions of the NAND flash memory device specified by the input. The one or more specified regions can include at least one of a region used for single-level cells (SLC), a region used for multi-level cells (MLC), a region used for triple-level cells (TLC), a region used for quad-level cells (QLC), a page, a block, and a plane.

In some embodiments, the programming method can include delaying a caching of future programming data until after the performing of the self-verification.

In some embodiments, the programming method can include detecting use of the caching, wherein the delaying can be based on the detecting of the use of the caching.

In some embodiments, a NAND flash memory device can enhance a debugging method using NAND self-verification. The NAND flash memory device can include a memory array including a plurality of pages. Each of the plurality of pages can include a plurality of memory cells corresponding to a word line. The NAND flash memory device can also include a peripheral circuit coupled to the plurality of pages via the word line. The peripheral circuit can program a selected page of the NAND flash memory device according to first and second programming data. The programming of the selected page can include a plurality of programming operations using a plurality of programming voltages. The programming of the selected page can also include a plurality of verifying operations. Ones of the plurality of verifying operations can be performed after corresponding ones of the plurality of programming operations to determine whether programmed memory cells of the selected page have threshold voltage levels according to the first or second programming data. The peripheral circuit can also perform a self-verification on the selected page to determine whether data stored at the selected page was overwritten. The NAND flash memory device can generate a fail indication upon determining that the data stored at the selected page was overwritten.

In some embodiments of the NAND flash memory device, the programming of the selected page is associated with can be associated with a memory controller-implemented program of the NAND flash memory device. The peripheral circuit can stop the memory controller-implemented program in response to the generating of the fail indication. The NAND flash memory device can communicate with a host-implemented program to debug the memory controller-implemented program based on a timing of the stopping of the memory controller-implemented program.

In some embodiments of the NAND flash memory device, the self-verification can include performing an internal read operation on the selected page by the NAND flash memory device to determine the data stored at the selected page.

In some embodiments of the NAND flash memory device, the NAND flash memory device can compare data determined from the internal read operation and the first or second programming data. The generating of the fail indication can include determining, based on the comparing, a fail result if the failed-bit count is above a threshold.

In some embodiments of the NAND flash memory device, the NAND flash memory device can receive an input to adjust the performing of the self-verification.

In some embodiments of the NAND flash memory device, the NAND flash memory device can also limit the performing of the self-verification to one or more regions of the NAND memory specified by the input. The one or more specified regions can include at least one of a region used for single-level cells (SLC), a region used for multi-level cells (MLC), a region used for triple-level cells (TLC), a region used for quad-level cells (QLC), a page, a block, and a plane.

In some embodiments of the NAND flash memory device, the NAND flash memory device can delay a caching of future programming data until after the performing of the self-verification.

In some embodiments of the NAND flash memory device, the NAND flash memory device can detect use of the caching, wherein the delaying can be based on the detecting of the use of the caching.

In some embodiments, a system can provide a method to enhance debugging using NAND self-verification. The system can include one or more computing devices and a NAND flash memory device. The NAND flash memory device can include a memory array including a plurality of pages. Each of the plurality of pages can include a plurality of memory cells corresponding to a word line. The NAND flash memory device can also include a peripheral circuit coupled to the plurality of pages via the word line. The peripheral circuit can program a selected page of the NAND flash memory device according to first and second programming data. The programming of the selected page can include a plurality of programming operations using a plurality of programming voltages. The programming of the selected page can also include a plurality of verifying operations. Ones of the plurality of verifying operations can be performed after corresponding ones of the plurality of programming operations to determine whether programmed memory cells of the selected page have threshold voltage levels according to the first or second programming data. The peripheral circuit can also perform a self-verification on the selected page to determine whether data stored at the selected page was overwritten. The NAND flash memory device can generate a fail indication upon determining that data stored at the selected page was overwritten.

In some embodiments of the system, the programming of the selected page can be associated with a memory controller-implemented program of the NAND flash memory device. The peripheral circuit can stop the memory controller-implemented program in response to the generating of the fail indication. The one or more computing devices can debug the memory controller-implemented program based on a timing of the stopping of the memory controller-implemented program.

In some embodiments of the system, the self-verification can include performing an internal read operation on the selected page by the NAND flash memory device to determine the data stored at the selected page.

In some embodiments of the system, the NAND flash memory device can compare data determined from the internal read operation on the selected page and the first or second programming data. The generating of the fail indication can include determining, based on the comparing, a fail result if the failed-bit count is above a threshold.

In some embodiments of the system, the NAND flash memory device can receive an input to adjust the performing of the read operation.

In some embodiments of the system, the NAND flash memory device can also limit the performing of the self-verification to one or more regions of the NAND flash memory device specified by the input. The one or more specified regions comprises at least one of a region used for single-level cells (SLC), a region used for multi-level cells (MLC), a region used for triple-level cells (TLC), a region used for quad-level cells (QLC), a page, a block, and a plane.

In some embodiments of the system, the NAND flash memory device can also delay a caching of future programming data until after the performing of the self-verification.

In some embodiments of the system, the NAND flash memory device can also detect use of the caching. The delaying can be based on the detecting of the use of the caching.

Other aspects of the present disclosure can be understood by those skilled in the art in light of the description, the claims, and the drawings of the present disclosure.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

FIG. 3 illustrates a schematic diagram of a memory die, according to some embodiments.

Figure 1:
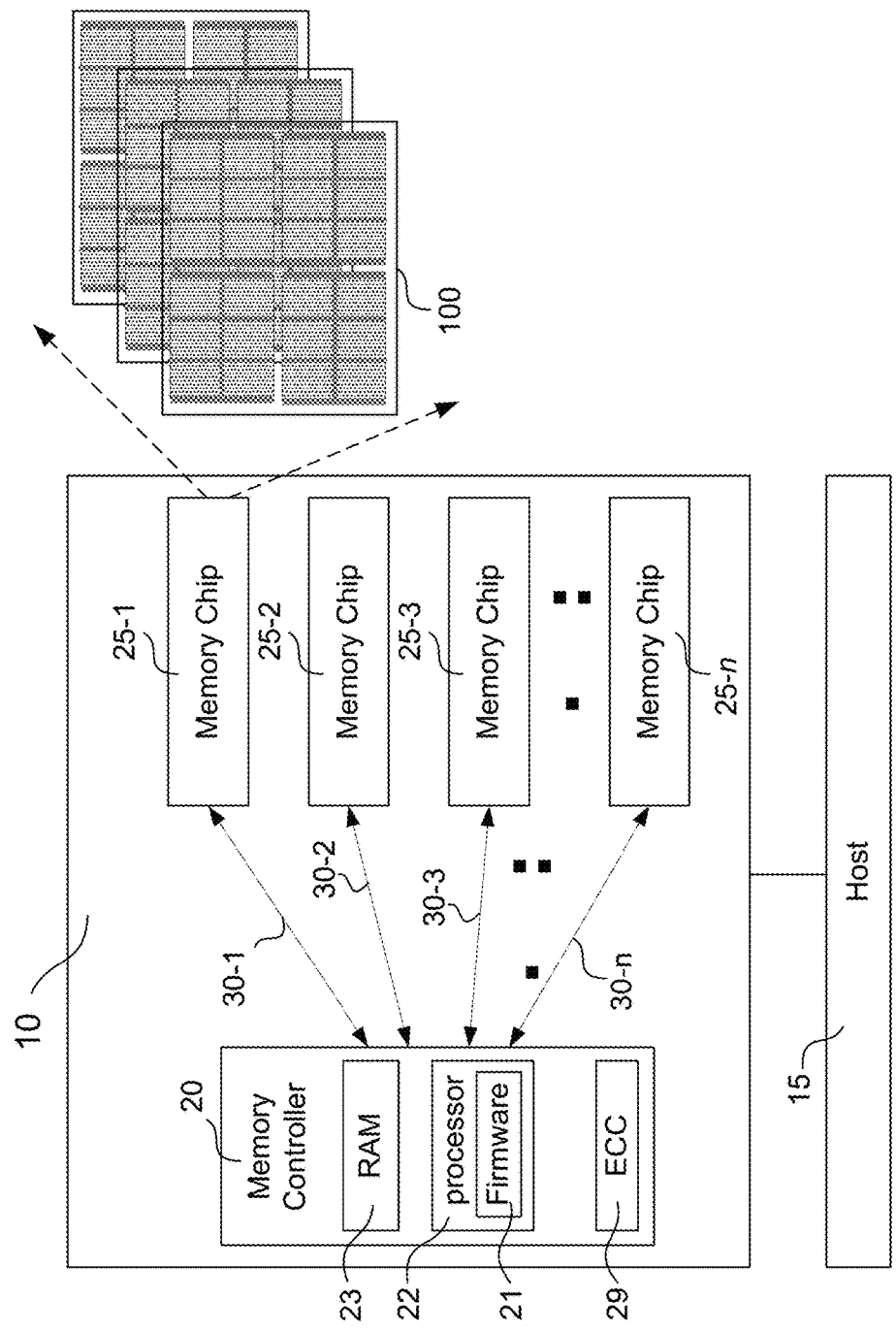
FIGS. 1 and 2A-2B illustrate a storage system with one or more memory chips, according to some embodiments.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described can include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to affect such feature, structure, or characteristic in connection with other embodiments whether or not explicitly described.

In general, terminology can be understood at least in part from usage in context. For example, the term "one or more" as used herein, depending at least in part upon context, can be used to describe any feature, structure, or characteristic in a singular sense or can be used to describe combinations of features, structures, or characteristics in a plural sense. Similarly, terms, such as "a," "an," or "the," again, can be understood to convey a singular usage or to convey a plural usage, depending at least in part upon context. In addition, the term "based on" can be understood as not necessarily intended to convey an exclusive set of factors and can, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something, but also includes the meaning of "on" something with an intermediate feature or a layer there between. Moreover, "above" or "over" not only means "above" or "over" something, but can also include the meaning it is "above" or "over" something with no intermediate feature or layer there between (i.e., directly on something).

Further, spatially relative terms, such as "beneath," "below," "lower," "above," "upper," and the like, can be used herein for ease of description to describe one element or feature's relationship to another element(s) or feature(s) as illustrated in the figures. The spatially relative terms are intended to encompass different orientations of the device in use or process step in addition to the orientation depicted in the figures. The apparatus can be otherwise oriented (rotated 90 degrees or at other orientations) and the spatially relative descriptors used herein can likewise be interpreted accordingly.

As used herein, the term "substrate" refers to a material onto which subsequent material layers are added. The substrate includes a "top" surface and a "bottom" surface. The top surface of the substrate is typically where a semiconductor device is formed, and therefore the semiconductor device is formed at a top side of the substrate unless stated otherwise. The bottom surface is opposite to the top surface and therefore a bottom side of the substrate is opposite to the top side of the substrate. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer has a top side and a bottom side where the bottom side of the layer is relatively close to the substrate and the top side is relatively away from the substrate. A layer can extend over the entirety of an underlying or overlying structure, or can have an extent less than the extent of an underlying or overlying structure. Further, a layer can be a region of a homogeneous or inhomogeneous continuous structure that has a thickness less than the thickness of the continuous structure. For example, a layer can be located between any set of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, there above, and/or there below. A layer can include multiple layers. For example, an interconnect layer can include one or more conductive and contact layers (in which contacts, interconnect lines, and/or vertical interconnect accesses (VIAs) are formed) and one or more dielectric layers.

In the present disclosure, for ease of description, "tier" is used to refer to elements of substantially the same height along the vertical direction. For example, a word line and the underlying gate dielectric layer can be referred to as "a tier," a word line and the underlying insulating layer can together be referred to as "a tier," word lines of substantially the same height can be referred to as "a tier of word lines" or similar, and so on.

As used herein, the term "nominal/nominally" refers to a desired, or target, value of a characteristic or parameter for a component or a process step, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

In the present disclosure, the term "horizontal/horizontally/lateral/laterally" means nominally parallel to a lateral surface of a substrate, and the term "vertical" or "vertically" means nominally perpendicular to the lateral surface of a substrate.

As used herein, the term "3D memory" refers to a three-dimensional (3D) semiconductor device with vertically oriented strings of memory cell transistors (referred to herein as "memory strings," such as NAND strings) on a laterally-oriented substrate so that the memory strings extend in the vertical direction with respect to the substrate.

FIG. 1 illustrates a block diagram of a system Si having a storage system 10, according to some embodiments. In some embodiments, system Si can be a mobile phone, a desktop computer, a laptop computer, a tablet, a vehicle computer, a gaming console, a printer, a positioning device, a wearable electronic device, a smart sensor, a virtual reality (VR) device, an augmented reality (AR) device, or any other suitable electronic devices having storage therein. Storage system 10 (e.g., a NAND storage system) can include a memory controller 20 and one or more semiconductor memory chips 25-1, 25-2, 25-3, ..., 25-n. Each semiconductor memory chip 25 (hereafter just "memory chip") can be a NAND chip (e.g., "flash," "NAND flash" or "NAND"). Storage system 10 can communicate with a host 15 through memory controller 20, where memory controller 20 can be connected to one or more memory chips 25-1, 25-2, 25-3, ..., 25-n, via one or more memory channels 30-1, 30-2, 30-3, ..., 30-n. In some embodiments, each memory chip 25 can be managed by memory controller 20 via one or more memory channels 30-1, 30-2, 30-3, ..., 30-n.

In some embodiments, host 15 can include a processor of an electronic device, such as a central processing unit (CPU), or a system-on-chip (SoC), such as an application processor (AP). Host 15 can send data to be stored at storage system 10 and/or can retrieve data from stored in storage system 10.

In some embodiments, memory controller 20 can handle I/O requests received from host 15, ensure data integrity and efficient storage, and manage memory chip 25. To perform these tasks, Memory controller 20 may run firmware 21, which can be executed by one or more processors 22 (e.g., micro-controller units, CPU) of memory controller 20. For example, memory controller 20 can run firmware 21 to map logical addresses (e.g., address utilized by the host associated with host data) to physical addresses in memory chip 25 (e.g., actual locations where the data is stored). Controller 20 also runs firmware 21 to manage defective memory blocks in the memory chip 25, where the firmware 21 can remap the logical address to a different physical address, i.e., move the data to a different physical address. The controller 20 can also include one or more memories 23 (e.g., DRAM, SRAM, EPROM, etc.), which can be used to store various metadata used by the firmware 21. In some embodiments, the memory controller 20 can also perform error recovery through an error correction code (ECC) engine 29. ECC is used to detect and correct the raw bit errors that occur within each memory chip 25.

In some embodiments, the memory channels 30 can provide data and control communication between the memory controller 20 and each memory chip 25 via a data bus. The memory controller 20 can select one of the memory chip 25 according to a chip enable signal.

In some embodiments, each memory chip 25 in FIG. 1 can include one or more memory dies 100, where each memory die can be a 3D NAND memory.

Figure 2A:
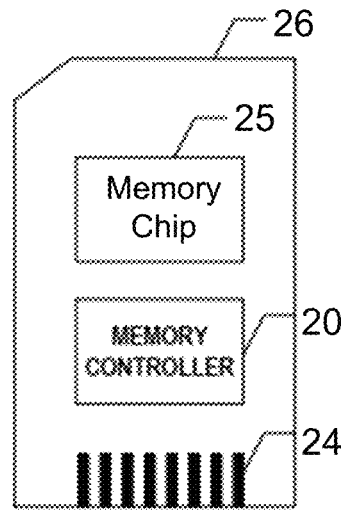
Figure 2B:
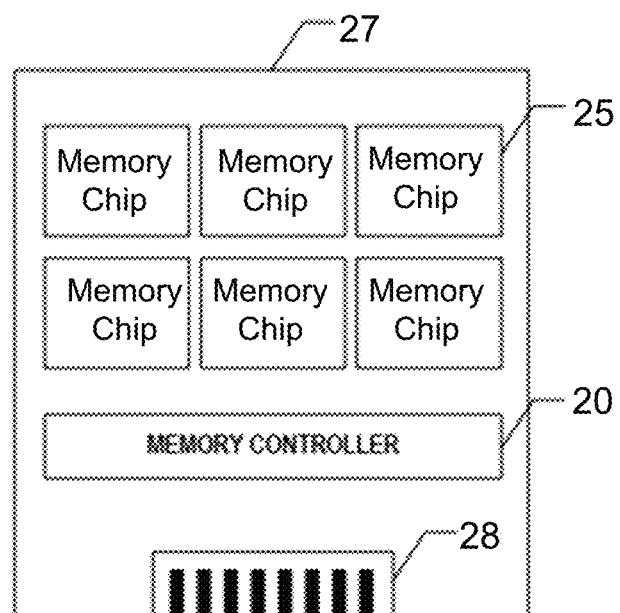

In some embodiments, memory controller 20 and one or more memory chip 25 can be integrated into various types of storage devices, for example, be included in the same package, such as a universal Flash storage (UFS) package or an eMMC package. That is, storage system 10 can be implemented and packaged into different types of end electronic products. In one example as shown in FIG. 2A, memory controller 20 and a single memory chip 25 can be integrated into a memory card 26. Memory card 26 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. Memory card 26 can further include a memory card connector 24 coupling memory card 26 with a host (e.g., the host 15 in FIG. 1). In another example as shown in FIG. 2B, memory controller 20 and multiple memory chip 25 can be integrated into an solid state drive (SSD) 27. SSD 27 can further include an SSD connector 28 coupling SSD 27 with a host (e.g., the host 15 in FIG. 1).

FIG. 3 illustrates a top-down view of a memory die 100, according to some embodiments. The example configuration shown in FIG. 3 is given as a non-limiting example and it is to be appreciated that memory is scalable. In some embodiments, memory die 100 can include one or more memory planes 101, each of which can include a plurality of memory blocks 103. Identical and concurrent operations can take place at each memory plane 101. Memory block 103, which can be megabytes (MB) in size, is the smallest size to carry out erase operations. Memory die 100 can include, for example, four memory planes 101. Each memory plane 101 can include, for example, six memory blocks 103. Each memory block 103 can include a plurality of memory cells, where each memory cell can be addressed through interconnections such as bit lines and word lines. The bit lines and word lines can be laid out perpendicularly (e.g., in rows and columns, respectively), forming an array of metal lines. The direction of bit lines and word lines are labeled as "BL" and "WL" in FIG. 3. In this disclosure, memory block 103 is also referred to as a "memory array" or "array." The memory array is the core area in a memory device, performing storage functions.

In some embodiments, memory die 100 can also include a periphery region 105, an area surrounding memory planes 101. The periphery region 105 can include many digital, analog, and/or mixed-signal circuits to support functions of the memory array, for example, page buffers, row and column decoders and sense amplifiers. Peripheral circuits use active and/or passive semiconductor devices, such as transistors, diodes, capacitors, resistors, etc., as would be apparent to a person of ordinary skill in the art.

In some embodiments, the arrangement of the memory planes 101 in the memory die 100 and the arrangement of the memory blocks 103 in each memory plane 101 illustrated in FIG. 3 are only used as an example, which does not limit the scope of the present disclosure.

Figure 4:
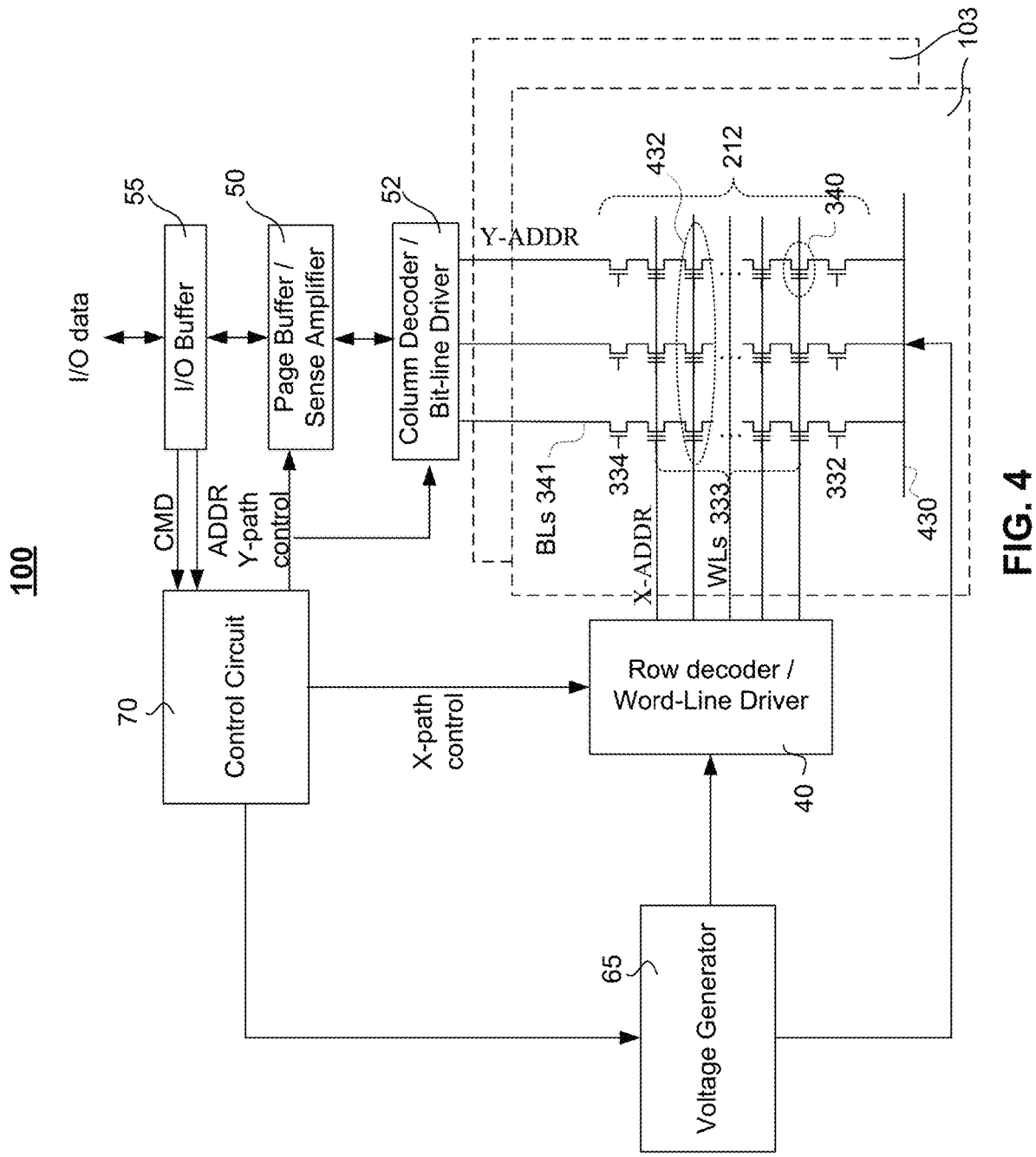
FIG. 4 illustrates a schematic of a three-dimensional (3D) memory die, according to some embodiments.

FIG. 4 illustrates a schematic diagram of the memory die 100, according to some embodiments. In some embodiments, memory die 100 can include one or more memory blocks 103 (e.g., 103-1, 103-2, 103-3). Each memory block 103 can include a plurality of memory strings 212. Each memory string 212 includes a plurality of memory cells 340. Memory cells 340 sharing the same word line forms a memory page 432. Memory string 212 can also include at least one field effect transistor (e.g., MOSFET) at each end, which is controlled by a lower select gate (LSG) 332 and a top select gate (TSG) 334, respectively. The drain terminal of the top select transistor 334-T can be connected to a bit line 341, and the source terminal of the lower select transistor 332-T can be connected to an array common source (ACS) 430. ACS 430 can be shared by the memory strings 212 in an entire memory block, and is also referred to as the common source line.

In some embodiments, memory die 100 can also include a periphery circuit that can include many digital, analog, and/or mixed-signal circuits to support functions of the memory block 103, for example, a page buffer/sense amplifier 50, a row decoder/word line driver 40, a column decoder/bit line driver 52, a control circuit 70, a voltage generator 65 and an input/output buffer 55. These circuits can include active and/or passive semiconductor devices, such as transistors, diodes, capacitors, resistors, etc., as would be apparent to a person of ordinary skill in the art.

In some embodiments, memory blocks 103 can be coupled with the row decoder/word line driver 40 via word lines ("WLs") 333, lower select gates ("LSGs") 332 and top select gates ("TSGs") 334. Memory blocks 103 can be coupled with page buffer/sense amplifier 50 via bit lines ("BLs") 341. Row decoder/word line driver 40 can select one of the memory blocks 103 on the memory die 100 in response to a X-path control signal provided by the control circuit 70. Rrow decoder/word line driver 40 can transfer voltages provided from the voltage generator 65 to the word lines according to the X-path control signal. During the read and program operation, the row decoder/word line driver 40 can transfer a read voltage $V_{read}$ and a program voltage $V_{pgm}$ to a selected word line and a pass voltage $V_{pass}$ to an unselected word line according to the X-path control signal received from the control circuit 70.

In some embodiments, column decoder/bit line driver 52 can transfer an inhibit voltage $V_{inhibit}$ to an unselected bit line and connect a selected bit line to ground according to a Y-path control signal received from control circuit 70. In other words, column decoder/bit line driver 52 can be configured to select or unselect one or more memory strings 212 according to the Y-path control signal from control circuit 70. The page buffer/sense amplifier 50 can be configured to read and program (write) data from and to the memory block 103 according to the control signal Y-path control from the control circuit 70. For example, the page buffer/sense amplifier 50 can store one page of data to be programmed into one memory page 432. In another example, page buffer/sense amplifier 50 can perform verify operations to ensure that the data has been properly programmed into each memory cell 340. In yet another example, during a read operation, page buffer/sense amplifier 50 can sense current flowing through the bit line 341 that reflects the logic state (i.e., data) of the memory cell 340 and amplify small signal to a measurable magnification.

In some embodiments, input/output buffer 55 can transfer the I/O data from/to the page buffer/sense amplifier 50 as well as addresses ADDR or commands CMD to the control circuit 70. In some embodiments, input/output buffer 55 can function as an interface between memory controller 20 (in FIG. 1) and memory die 100 on memory chip 25.

In some embodiments, control circuit 70 can control page buffer/sense amplifier 50 and row decoder/word line driver 40 in response to the commands CMD transferred by the input/output buffer 55. During the program operation, control circuit 70 can control row decoder/word line driver 40 and page buffer/sense amplifier 50 to program a selected memory cell. During the read operation, control circuit 70 can control row decoder/word line driver 40 and the page buffer/sense amplifier 50 to read a selected memory cell. The X-path control signal and the Y-path control signal include a row address X-ADDR and a column address Y-ADDR that can be used to locate the selected memory cell in the memory block 103. The row address X-ADDR can include a page index PD, a block index BD and a plane index PL to identify memory page 432, memory block 103, and memory plane 101 (in FIG. 3), respectively. The column address Y-ADDR can identify a byte or a word in the data of the memory page 432.

In some embodiments, voltage generator 65 can generate voltages to be supplied to word lines and bit lines under the control of control circuit 70. The voltages generated by voltage generator 65 include the read voltage $V_{read}$, the program voltage $V_{pgm}$, the pass voltage $V_{pass}$, the inhibit voltage $V_{inhibit}$, etc.

It is noted that the arrangement of the electronic components in the storage system 10 and the memory die 100 in FIGS. 1, 2A-2B, and 3-4 are shown as non-limiting examples. In some embodiments, storage system 10 and memory die 100 can have other layout and can include additional components. Components (e.g., control circuit 70, I/O buffer 55) on memory die 100 shown in FIG. 4 can also be moved off memory die 100, as a stand-alone electric component in the storage system 10. Components (e.g., control circuit 70, I/O buffer 55) on memory die 100 shown in FIG. 4 can also be moved to other components in storage system 10, for example, a portion of control circuit 70 can be combined with memory controller 20 and vice versa.

Figure 5:
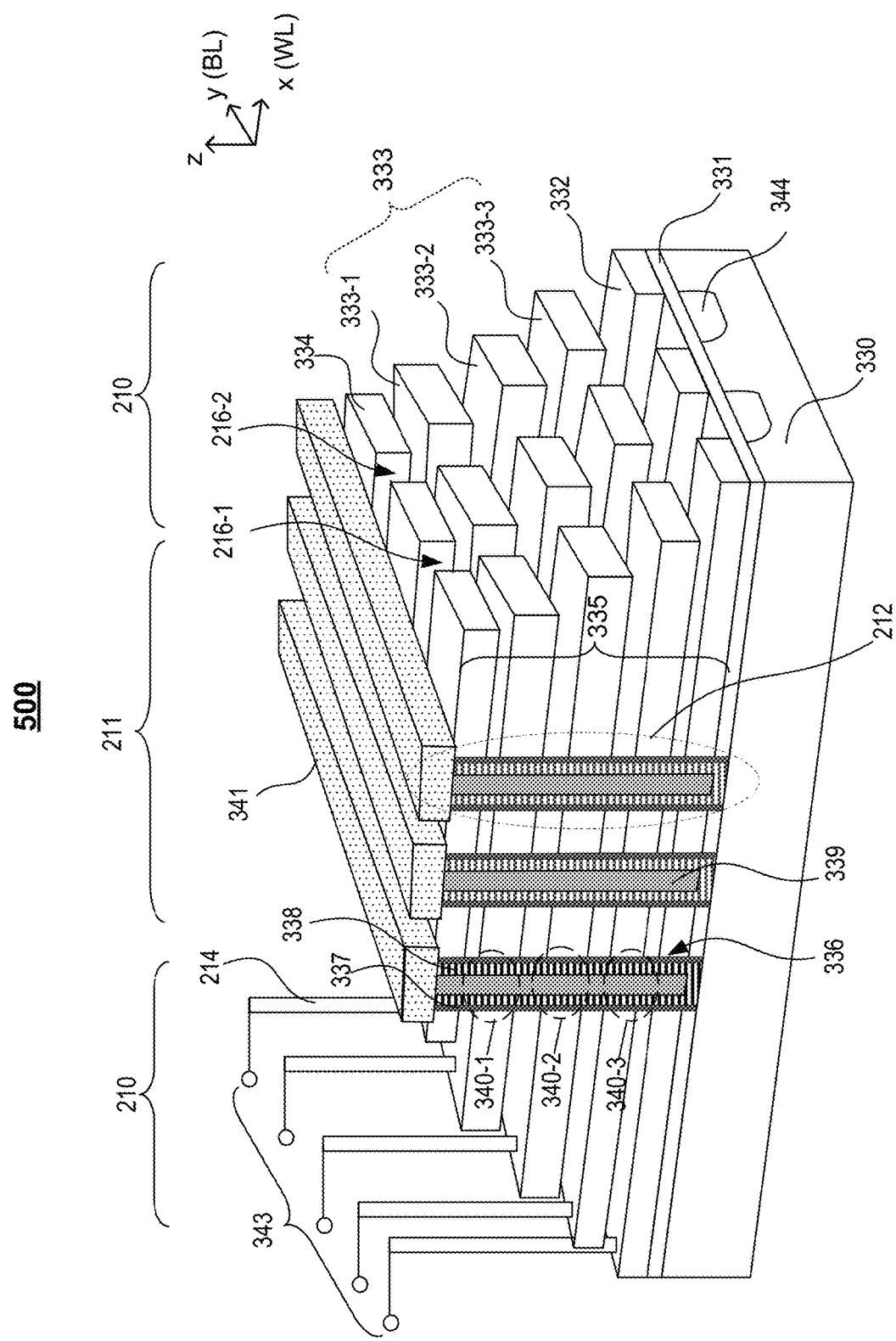
FIG. 5 illustrates a perspective view of a portion of a 3D memory structure, in accordance with some embodiments.

FIG. 5 illustrates a perspective view of a 3D memory structure 500, according to some embodiments. In some embodiments, memory die 100 can be a 3D NAND memory, and the 3D memory structure 500 can be a portion of memory die 100, for example, in a region 108 in FIG. 3. The 3D memory structure 500 can include a staircase region 210 and a channel structure region 211. Channel structure region 211 can include a plurality of memory strings 212, each including a plurality of stacked memory cells 340. Staircase region 210 can include a staircase structure.

In some embodiments, the 3D memory structure 500 can include a substrate 330, an insulating film 331 over the substrate 330, a tier of lower select gates (LSGs) 332 over the insulating film 331, and a plurality of tiers of control gates 333, also referred to as "word lines (WLs)," stacking on top of the LSGs 332 to form a film stack 335 of alternating conductive and dielectric layers. The dielectric layers adjacent to the tiers of control gates are not shown in FIG. 5 for clarity.

In some embodiments, the control gates of each tier are separated by slit structures 216-1 and 216-2 through the film stack 335. The 3D memory structure 500 can also include a tier of top select gates (TSGs) 334 over the stack of control gates 333. The stack of TSG 334, control gates 333 and LSG 332 can also be referred to as "gate electrodes." The 3D memory structure 500 can further include doped source line regions 344 in portions of substrate 330 between adjacent LSGs 332. Each of memory strings 212 of the 3D memory structure 500 can include a channel hole 336 extending through the insulating film 331 and the film stack 335 of alternating conductive and dielectric layers. Memory string 212 can also include a memory film 337 on a sidewall of the channel hole 336, a channel layer 338 over memory film 337, and a core filling film 339 surrounded by channel layer 338. Memory cell 340 (e.g., 340-1, 340-2, 340-3) can be formed at the intersection of the control gate 333 (e.g., 333-1, 333-2, 333-3) and memory string 212. A portion of channel layer 338 can respond to the respective control gate and is also referred to as channel 338 of the memory cell. The 3D memory structure 500 further includes a plurality of bit lines (BLs) 341 connected with the memory strings 212 over the TSGs 334. The 3D memory structure 500 can also include a plurality of metal interconnect lines 343 connected with the gate electrodes through a plurality of contact structures 214. The edge of film stack 335 is configured in a shape of staircase to allow an electrical connection to each tier of the gate electrodes.

In FIG. 5, for illustrative purposes, three tiers of control gates 333-1, 333-2, and 333-3 are shown together with one tier of TSG 334 and one tier of LSG 332. In this example, each memory string 212 can include three memory cells 340-1, 340-2 and 340-3, corresponding to control gates 333-1, 333-2 and 333-3, respectively. In some embodiments, the number of control gates and the number of memory cells can be more than three to increase storage capacity. The 3D memory structure 500 can also include other structures, for example, TSG cut, common source contact (i.e., array common source) and dummy memory string. These structures are not shown in FIG. 5 for simplicity. It is noted that the 3D memory structure 500 shown in FIG. 5 is only used as an example, which does not limit the scope of the present disclosure, and any other suitable 3D memory structure can also be adapted.

Referring back to FIG. 4, in some embodiments, memory block 103 can be formed based on floating gate technology. In some embodiments, the memory block 103 can be formed based on charge trapping technology. The NAND flash memory based on charge trapping can provide high storage density and high intrinsic reliability. Storage data in the form of logic states ("states," e.g., threshold voltages Vth of the memory cell 340) depends on the number of charge carriers trapped in the memory film 337 of the memory cell 340.

In some embodiments, in a NAND flash memory, a read operation and a write operation (also referred to as program operation) can be performed for the memory page 432, and an erase operation can be performed for the memory block 103.

In some embodiments, in a NAND memory, the memory cell 340 can be in an erased state ER or a programmed state P1. Initially, memory cells 340 in memory block 103 can be reset to the erased state ER as logic "1" by implementing a negative voltage difference between control gates 333 and channel 338 such that trapped charge carriers in the memory film of memory cells 340 can be removed. For example, the negative voltage difference can be induced by setting control gates 333 of memory cells 340 to ground, and applying a high positive voltage (an erase voltage $V_{erase}$) to ACS 430. At the erased state ER ("state ER"), the threshold voltage Vth of memory cells 340 can be reset to the lowest value.

In some embodiments, during programming (i.e., writing), a positive voltage difference between control gates 333 and channel 338 can be established by, for example, applying a program voltage $V_{pgm}$ (e.g., a positive voltage pulse between 10 V and 20 V) on control gate 333, and grounding the corresponding bit line 341. As a result, charge carriers (e.g., electrons) can be injected into the memory film of memory cell 340, thereby increasing the threshold voltage Vth of memory cell 340. Accordingly, memory cell 340 can be programmed to the programmed state P1 ("state P1" or logic "0").

In some embodiments, the state of the memory cell (e.g., state ER or state P1) can be determined by measuring or sensing the threshold voltage Vth of the memory cell. During a read operation, a read voltage $V_{read}$ can be applied on control gate 333 of the memory cell and current flowing through the memory cell can be measured at bit line 341. A pass voltage $V_{pass}$ can be applied on unselected word lines to switch on unselected memory cells.

In some embodiments, a NAND flash memory can be configured to operate in a single-level cell (SLC) mode. To increase storage capacity, a NAND flash memory can also be configured to operate in a multi-level cell (MLC) mode, a triple-level cell (TLC) mode, a quad-level cell (QLC) mode, or a combination of any of these modes. In the SLC mode, a memory cell stores 1 bit and has two logic states ("states"), logic {1 and 0}, i.e., states ER and P1. In the MLC mode, a memory cell stores 2 bits, and has four logic states, logic {11, 10, 01, and 00}, i.e., states ER, P1, P2, and P3. In the TLC mode, a memory cell stores 3 bits, and has eight logic states, logic {111, 110, 101, 100, 011, 010, 001, 000}, i.e., states ER, and states P1-P7. In the QLC mode, a memory cell stores 4 bits and has 16 logic states. Memory controller 20 of storage system 10 (see FIG. 1) can convert data received from host 15 into corresponding logic states of the memory cells on memory dies 100 and vice versa.

Figure 6:
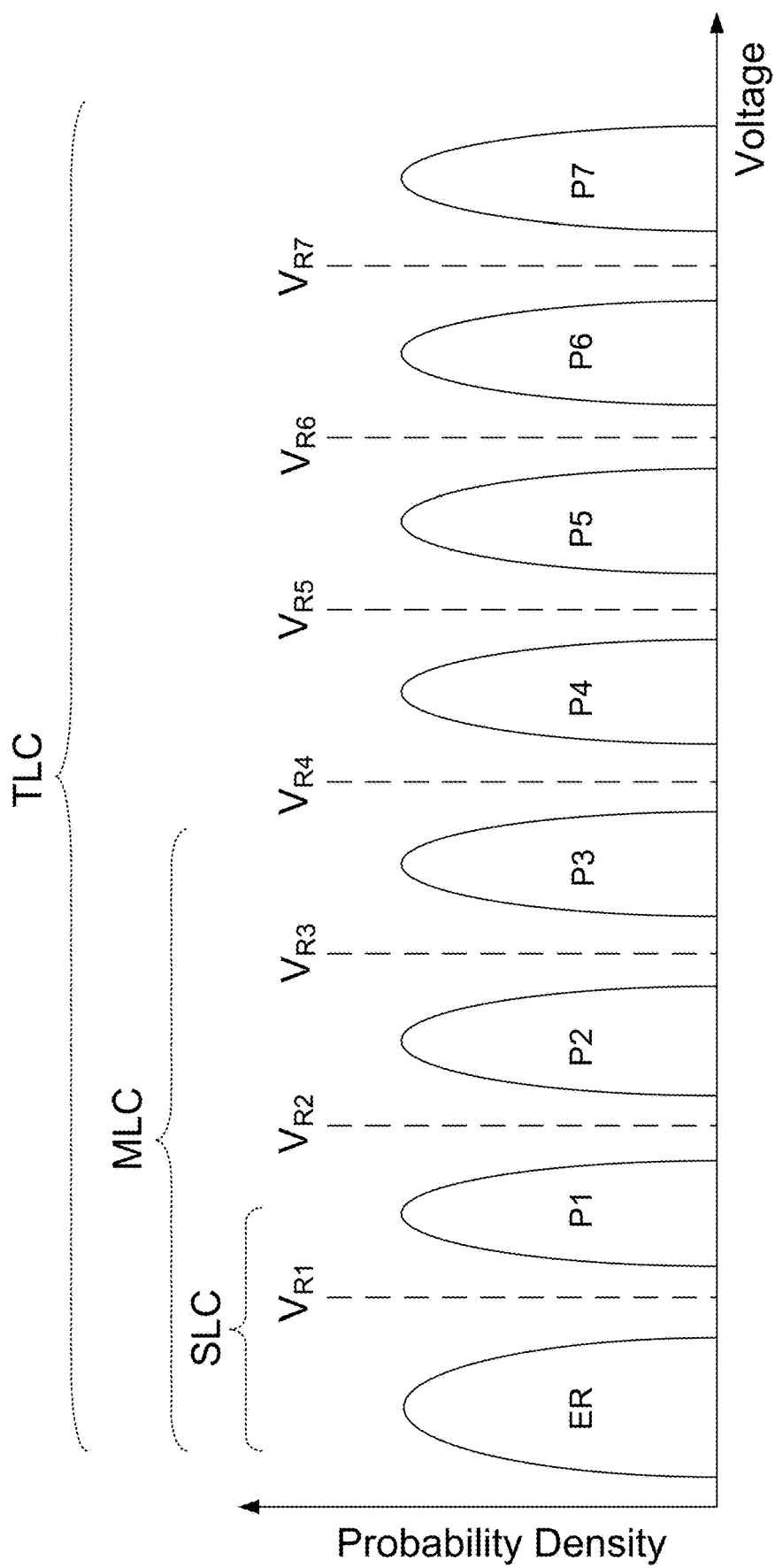
FIG. 6 illustrates a threshold voltage Vth distribution of a NAND flash memory, according to some embodiments.

FIG. 6 illustrates a threshold voltage Vth distribution of a NAND flash memory programmed in the triple-level cell (TLC) mode, according to some embodiments. In some embodiments, each state of the memory cells can correspond to a specific range of threshold voltage Vth, where the threshold voltage Vth distribution of each state can be represented by a probability density. In some embodiments, the eight TLC states can be programmed by using an incremental step pulse programming (ISPP) scheme where the programming voltage $V_{pgm}$ can be incrementally increased by adding a step pulse $V_{step}$. Accordingly, the eight TLC states can be programmed from the state P1 with a lower threshold voltage to the state P7 with a highest threshold voltage.

In some embodiments, after programming, the eight TLC states ER and P1-P7 can be verified by using one or more read reference voltages $V_{R1}$-$V_{R7}$ during a verification process. By applying one or more of the read reference voltages $V_{R1}$-$V_{R7}$ to the control gate of a target memory cell, the range of the memory cell's threshold voltage Vth can be determined. For example, to verify if a memory cell is at state ER, the read reference voltage $V_{R1}$ can be used. If the target memory cell is at state ER, the threshold voltage Vth of the target memory cell is lower than the read reference voltage $V_{R1}$. The target memory cell can be switched on and form a conductive path in the channel. If the target memory cell is at any one of the states P1-P7, the threshold voltage Vth of the target memory cell is higher than the read reference voltage $V_{R1}$. The target memory cell is thereby switched off. By measuring or sensing the current through the target memory cell at the corresponding bit line, via the page buffer/sense amplifier 50, the threshold voltage Vth or the state of the target memory cell can be verified.

In some embodiments, as described above, to determine the two states ER and P1 stored in the SLC mode, it is sufficient to rely on just the read reference voltage $V_{R1}$. To determine the four states ER and P1-P3 in the MLC mode, the read reference voltages $V_{R1}$, $V_{R2}$ and $V_{R3}$ can be used. To determine the eight states ER and P1-P7 for the TLC mode, the read reference voltages $V_{R1}$-$V_{R7}$ can be used. For example, in the TLC mode, the threshold voltage of state ER is below $V_{R1}$, and the threshold voltage of state P7 is above $V_{R7}$, where the threshold voltages of state P1 is between $V_{R1}$ and $V_{R2}$. States P2-P6 can be determined similarly.

Figure 7:
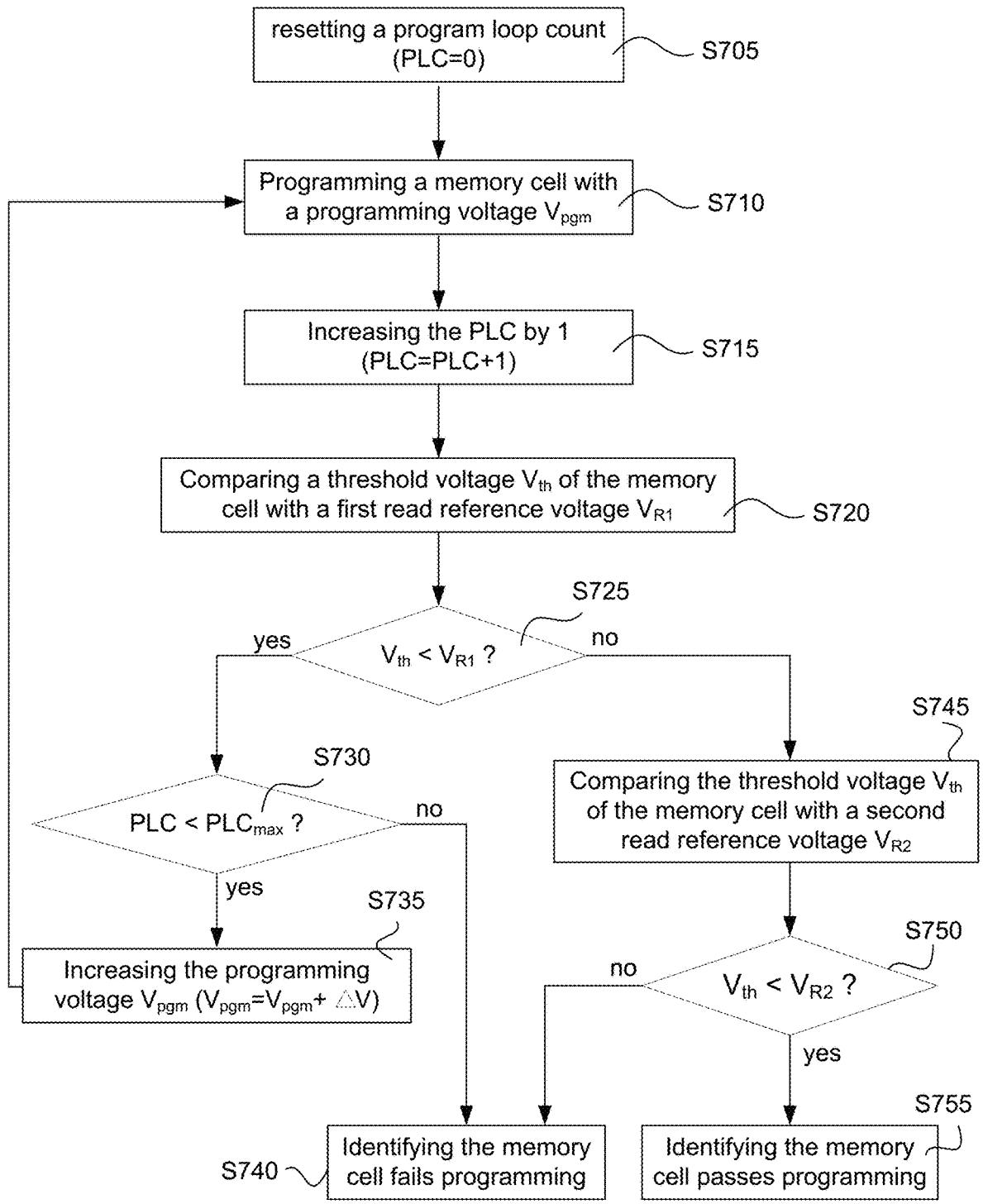
FIG. 7 illustrates a method of programming a memory cell, according to some embodiments.

FIG. 7 illustrates a process flow 700 for programming a memory cell to a target logic state (e.g., the state P1), according to some embodiments. It should be appreciated that the process flow 700 is not exhaustive and that other operation steps can be performed as well before, after, or between any of the illustrated operation steps. In some embodiments, some operation steps of the process flow 700 can be omitted or other operation steps can be included, which are not described here for simplicity. In some embodiments, operation steps of the process flow 700 can be performed in a different order and/or vary.

In some embodiments, at operation step S705, a program loop count (PLC) can be reset, for example, PLC=0. The operation step S705 can be started when memory controller 20 (FIG. 1) sends a command to memory die 100 for programming the memory cell on memory die 100.

At operation step S710, a memory cell is programmed by applying a programming voltage $V_{pgm}$ to a word line of the memory cell. And the PLC can be increased by 1 at operation step S715, i.e., PLC=PLC+1. The programming voltage $V_{pgm}$ can be selected according to the target logic state of the memory cell, where the target logic state depends on programming data sent by the memory controller 20.

At operation step S720, a threshold voltage Vth of the memory cell can be compared with a first read reference voltage (also called program-verify level) by applying the first read reference voltage on the word line of the memory cell and measuring the current flowing through the memory cell at the corresponding bit line. For example, if the memory cell is to be programmed to a target logic state of P1, the first read reference voltage $V_{R1}$ can be used (see FIG. 6) because for the state P1, a pass condition is that the threshold voltage of the memory cell be between the read reference voltages $V_{R1}$ and $V_{R2}$.

At operation step S725, the threshold voltage Vth of the memory cell is determined whether it is higher or lower than the first read reference voltage $V_{R1}$. As discussed previously, if the threshold voltage Vth of the memory cell is lower than the first read reference voltage $V_{R1}$, the memory cell can be switch on, forming a conductive path in the channel. The current measured at the corresponding bit line by the page buffer/sense amplifier 50 (in FIG. 4) is relatively higher. If the threshold voltage Vth of the memory cell is higher than the first read reference voltage $V_{R1}$, the memory cell is switched off and the current measured at the corresponding bit line by the page buffer/sense amplifier 50 is relatively lower.

If the threshold voltage Vth of the memory cell is determined to be lower than the first read reference voltage $V_{R1}$, the process flow 700 goes to operation step S730, where the PLC is checked if it is less than a maximum value $PLC_{max}$.

In some embodiments, the maximum value $PLC_{max}$ can be a predetermined value, e.g., $PLC_{max}$=25. In some embodiments, the maximum value $PLC_{max}$ can be determined from PLCs of a set of memory cells selected across different memory dies during a pre-screening programming test.

If the PLC is less than $PLC_{max}$, at operation step S735, the programming voltage $V_{pgm}$ can be increased by an amount $\Delta V$, such that the programming voltage $V_{pgm}=V_{pgm}+\Delta V$. And the memory cell can be re-programmed again with the increased programming voltage $V_{pgm}$ at operation step S710.

The operation steps S710-S735 can be repeated until the desired target threshold voltage Vth is reached for the memory cell. However, if at operation step S730, the $PLC_{max}$ has been reached but the memory cell is still not programmed to the target logic state, the memory cell can be identified having programming failure at step S740.

If at operation step S725, the threshold voltage Vth of the memory cell is determined to be higher than the first read reference voltage $V_{R1}$, it can be compared with a second read reference voltage at operation step S745. If the memory cell is to be programmed to the target logic state of P1, the second read reference voltage $V_{R2}$ can be used (see FIG. 6). If the threshold voltage Vth of the memory cell is determined to be lower than the second read reference voltage $V_{R2}$ at operation step S750, the memory cell can be identified as programming pass (i.e., programmed to a target logic state) at operation step S755. In the SLC mode with only state ER and P1, the second reference voltage can be omitted.

However, if the threshold voltage Vth of the memory cell is determined to be higher than the second read reference voltage $V_{R2}$ at operation step S750, the memory cell can be identified having programming failure at step S740 because during programming the threshold voltage of a memory cell can be increased by applying the programming voltage $V_{pgm}$ on its control gate (i.e. corresponding word line), but cannot be decreased. In a 3D NAND memory, a memory cell can be re-programmed to a logic state with a lower threshold voltage after the memory cell is erased and reset to the state ER. The erase operation reset all memory cells in the memory block to the state ER because the memory cells in the same memory block share the same array common source 430.

Referring back to FIG. 4, in some embodiments, while a memory block (e.g., the memory block 103) is the smallest erasable unit in a 3D NAND memory, a memory page (e.g., the memory page 432) is the smallest addressable unit for read and program operations. During the read and program operations, data (i.e., logic states) in a memory page of a selected memory block can be read or programmed according to the page index PD and the block index BD included in the address ADDR received by the control circuit 70. The memory cells which have reached a target logic state (i.e., a target threshold voltage) can be inhibited from further programming by applying the inhibit voltage $V_{inhibit}$ on the corresponding bit lines 341.

Above, embodiments have been described regarding structures of 3D NAND memory and functions thereof. In some embodiments, it is desirable to provide reliable memory cells for programming, as well as subsequent erasure and reprogramming. The method referencing FIG. 7 showed an example of how to verify a memory cell after a programming operation. At the end of process flow 700, a memory cell can either pass or fail the verification process. Those skilled in the art will appreciate that once a programming and verification operation on a memory cell has ended (pass or fail), the programming and verification operations can move on to the next memory cell (i.e., process flow 700 can start anew at the next memory cell). In some embodiments, moving on to the next memory cell can comprise "masking" the finished memory cell so that the algorithm iterating process flow 700 does not mistakenly repeat on the same memory cell. Masking a memory cell (or masking memory bits), can be described as marking or flagging a memory cell, either temporarily or permanently, so that future operations can be adjusted based on the flag (e.g., to be skipped). In one example, bits can be masked permanently when a non-correctable failure is found. The NAND controller can disallow any further use of defective memory cells. One example of masking was described above in reference to FIG. 4 and the use of inhibit voltage $V_{inhibit}$ on corresponding bit lines 341.

In some embodiments, process flow 700 can be sufficient for memory cells that are to receive programming (i.e., an operation that changes the state of a memory cell from ER to a higher state, such as P1). According to process flow 700, the verification process starting at S720 can follow the programming step at S710 (e.g., programming a memory cell with a programming voltage then verifying for correctness). But, what about memory cells that are to remain in the ER state? In an example scenario, an 8 bit string is sought to be written to one of memory pages 432 (FIG. 4). The 8 bit string can comprise, for example, bits corresponding to electronic states {P1 ER ER P1 ER P1 ER ER}. One can appreciate that the memory cells receiving the P1 state would undergo step S710 and subsequently get verified by steps S720 and onward. However, the cells to remain at the ER state would not undergo steps S710 and S720. It is general practice to erase a block of memory before writing new data onto the block (e.g., typically, all memory cells in the block start in the ER state before programming begins). Therefore, to write ER states of the programming data into memory cells, the NAND does nothing to the memory cells (i.e., the memory cell gets skipped, relying on the assumption that the memory cell was already in the ER state).

To reiterate, in some embodiments, programming a page does not equate to programming every memory cell in the page. Some cells can skip receiving programming operation. Therefore, programming a page can include programming just one or more of the memory cells in the page. Verification is performed when a memory cell is programmed (e.g., ER→P1 can trigger a verification operation), but not when a memory cell is to remain at ER (e.g., ER→ER memory cell is not programmed and therefore verification can be skipped). Therein, a problem can arise due to the skipping of the verification. This can be a problem if the existing state in the skipped memory cell was not the expected ER (e.g., the memory cell has a persisting P1 state). In this scenario, the writing operations would assume that the memory cell is in an ER state when it is not. In turn, the memory controller would assume that the "write" operation ER→ER was successfully performed (for lack of verification), but what has actually happened is that the P1 state persists (P1→P1). When data from this memory cell is read from in the future, it would be found that the data has been corrupted. Therefore, a need exists for a method and a system to provide data protection before an uncorrectable error correction code (UECC) appears such that chances of data loss can be minimized.

In order to mitigate errors as described above, operations can be introduced to make processes such as process flow 700 more robust.

Figure 8A:
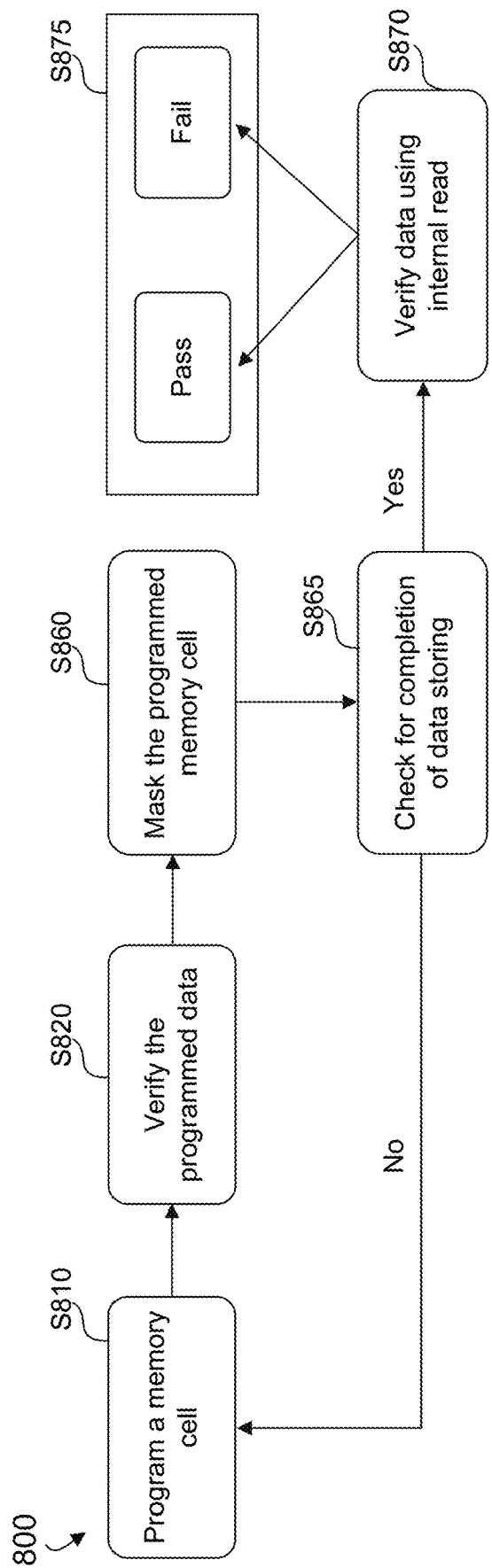
FIG. 8A illustrates a method of storing data and self-verification of data in a NAND memory, according to some embodiments.
Figure 8B:
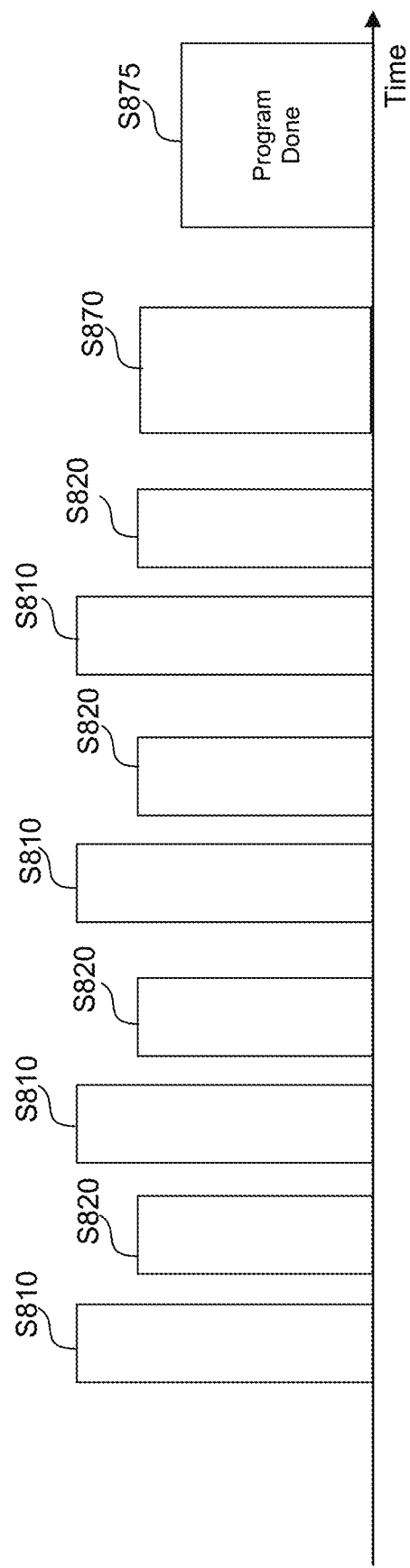
FIG. 8B illustrates a timeline using the method described in FIG. 8A, according to some embodiments.
Figure 10:
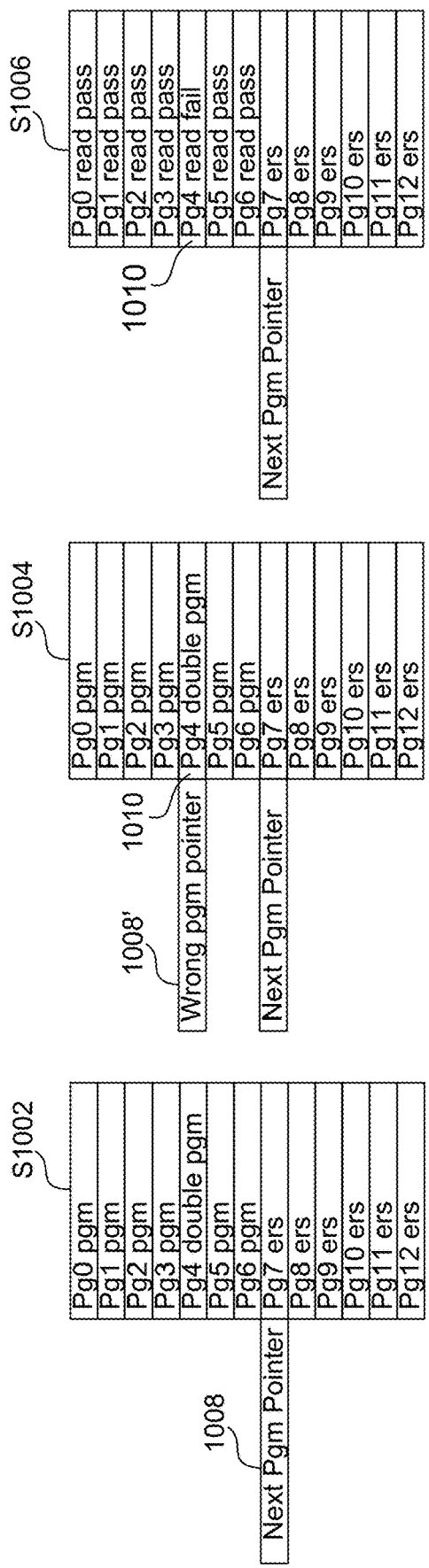
FIG. 10 illustrates snapshots of a portion of the NAND memory in which a double program event occurs, according to some embodiments.

FIG. 8 illustrates a process flow 800 for storing data and self-verification of data in a NAND memory, according to some embodiments. In some embodiments, the functions described in the method stops can be performed by the circuitry on the NAND memory device itself (e.g., one or more processors 22 (FIG. 1), control circuits in memory chips 25 (FIG. 10, or the like). At step S810, data can be stored in a page of the NAND memory. The data to be stored can include a series of bits (e.g., binary data), which can also be referred to as programming data (e.g., data that is to be programmed in the page). The page of the NAND memory can include memory cells (e.g., page 432 (FIG. 4)). The storing can include programming a selected page of the NAND memory according to the programming data. The selected page includes a plurality of memory cells corresponding to a word line. The programming of the selected page can include a plurality of programming operations using a plurality of programming voltages (steps S810). The programming of the selected page can also include a plurality of verifying operations (steps S820). Ones of the plurality of verifying operations can be performed after corresponding ones of the plurality of programming operations to determine whether programmed memory cells of the plurality of memory cells have threshold voltage levels according to the programming data. At step S820, verification of the programming of the memory cell can be performed to ascertain whether the programming was performed correctly or if step S810 should be performed again (see e.g., step S735 (FIG. 7)). The verifying can include applying a reference voltage on a word line of the programmed one of the memory cells and measuring a current flowing through the programmed one of the memory cells at a corresponding bit line (see e.g., S720 (FIG. 7)).

In some embodiments, at step S860, the programmed one of the memory cells can be masked after the verifying of step S820 (e.g., if the result is a pass, then mask the memory cell for the remainder of the data storing process; if result is a fail, then restart at S810). At step S865, a check can be performed to determine whether a target number of bits has been programmed in the page according to the (e.g., checking to see if the storing of the programming data is complete or incomplete). In other words, a determination step is performed to ascertain whether a final bit according to the programming data has been programmed in the page (e.g., the final bit can be the last non-ER state to be programmed in the page according to the programming data). If the storing has not yet concluded, the process can go back to step S810 and move on to subsequent memory cells for storing the remainder of the programming. It should be appreciated that process flow 800 can include determining a completion of the programming of the selected page based on each of the plurality of verification operations returning a pass result. Another condition for determining a completion of programming can be to consider a memory cell for storing n bits of the programming data, with n being a whole number greater than 1. The determining can be based on programming an nth bit of the programming data into the page.

In some embodiments, at step 870, another verify operation can be performed by performing a read operation on the page and comparing data determined from the self-verify read operation to the programming data that was used to initiate process flow 800. The steps of FIG. 8 can be implemented as a firmware method in the NAND controller (e.g., controller 20 (FIG. 1)).

In some embodiments, at step S875, process flow 800 to store data in the NAND page is concluded. The conclusion can be marked by a pass or fail determination from the additional verifying step S870. The pass/fail determination can be based on an exact match between the stored data as determined by the read operation on the page and the programming data that was used to initiate process flow 800. In some embodiments, the pass/fail determination can be based on a fail count threshold. For example, the NAND firmware can determine a pass result if a failed-bit count is below a given threshold. It should be appreciated that the term "below a threshold" is also intended to include the scope of "below or equal to a threshold" since the difference between the two terms is a mere shift of the threshold value (e.g., below 10 is same as below or equal to 9). A similar logic is applied to the terms "above a threshold" and "above or equal to a threshold". The threshold can be adjusted based on needs or preferences of the environment in which the NAND memory is to be implemented. For example, a data storage center with multiple redundancy backup mechanisms may use threshold value that is different from a user on a personal computer.

In some embodiments, the timeline shown in FIG. 8 shows an example of the process described thus far. For example, there may be a number of loops of steps S810 and S820 to program and verify a number of memory cells in the page of the NAND memory (other steps are not illustrated on the timeline for clarity, but should be understood to be present). At the end of the loops (that is, when the programming data has been fully transferred to the page), step S870 is performed to verify the stored data using the internal read capability of the NAND memory. The programming of the page of the NAND memory is then concluded at step S875.

It was mentioned before, in some embodiments, process flow 800 can be used to increase NAND memory robustness in situations where process flow 700 (FIG. 7) does not execute, for example, when the data-to-be-written is an ER state, but the actual state present in the corresponding memory cell is P1 or the like. Such instances can arise when, for example, a first program stores data on a page but then a second program stores its data on the same page (e.g., overprogramming of memory). Overprogramming errors can be caused by poor coding. Whether or not step S820 (or step 720 FIG. 7)) is performed, the self-verification at step 870 is capable of reading the full page, thereby detecting any errors that a non-executed step S820 may have missed. Data corruption can be prevented in this manner. For example, if a fail result is issued at step S875, the firmware in the memory controller can select a different page to store the program data. The NAND memory can also prevent further use of one or more faulty regions of the NAND memory if the read operation of step S870 returns a fail result (e.g., masking the region of the NAND memory). Furthermore, step S870 can be a single instance at the end of the data storing process, which can result in a far smaller time burden than, for example, performing the read verification after every loop.

In some embodiments, the NAND firmware implementation of step S870 allows the additional verification to be performed quickly as well as at the early stages of a data storing operation. Since the reading of the page is performed by the hardware on the NAND memory itself, the read operation can also be referred to as internal read, or self-verification. In contrast, if an external host computer were to perform step S870, the resulting additional time burden can be high enough to discourage performing step S870.

In some embodiments, the additional verification of step S870 can be accompanied with certain drawbacks. For example, even if an internal firmware implementation is faster than a host firmware implementation, verification step S870 can still increase the time of read operations to an extent that might be undesirable to consumers of the NAND memory. After all, step S870 is an additional read step and can add, for example, tens of microseconds to a data storing process. Therefore, the NAND memory firmware can be implemented with a feature to allow adjusting how step S870 is executed by the NAND firmware. That is, in some embodiments, the method can include receiving, at the NAND memory, an input to adjust the verifying the storing of the data in the page.

In some embodiments, the input can allow, disable, shift in time, or the like, the performing of the read operation of step S870 as well as limiting which regions of the NAND memory are to receive step S870. Some regions of the NAND memory can be more reliable than others. Therefore, the input can be used to specify one or more regions of the NAND memory to allow or disable performing the read operation of step S870. The one or more specified regions can include, for example, at least one of a region used for SLC, a region used for MLC, a region used for TLC, a region used for QLC, a page, a block, or plane—to name a few non-limiting examples. As an example, an input can include instructions to perform self-verification on a first SLC portion, first and second TLC portions, and a specific page. As another example, an input can include instructions to perform self-verification on a specific QLC portion. The terms such as "at least one of element 1, element 2, and element 3," or the like, can refer to permutations such as: one or more of element 1; one or more of element 2; one or more of element 1 and one or more of element 2; one or more of element 1 and one or more of element 3; one or more of element 2 and one or more of element 3; or one or more of element 1, one or more of element 2, and one or more of element 3. Corresponding permutations are envisaged for groups having fewer or more elements.

In some embodiments, the input can be implemented as a prefix of a user provided command for executing the data storing operations. There can be one or two bits for specifying SLC/MLC/TLC/QLC modes. There can be, for example, three bits for specifying any of the upper, middle, or lower pages of a TLC page.

In some embodiments, the NAND firmware can determine when and where to implement self-verification in an automated manner (without needing user input). For example, a NAND memory can implement a record of which memory cells or groups of memory cells are defective or otherwise risky. Based on the record, the NAND firmware can implement self-verification when storing data in memory cells that are known to have an associated risk.

In some embodiments, the input can also adjust how certain data is handled during the data storing process (e.g., delay purging of cached data).

Figure 9:
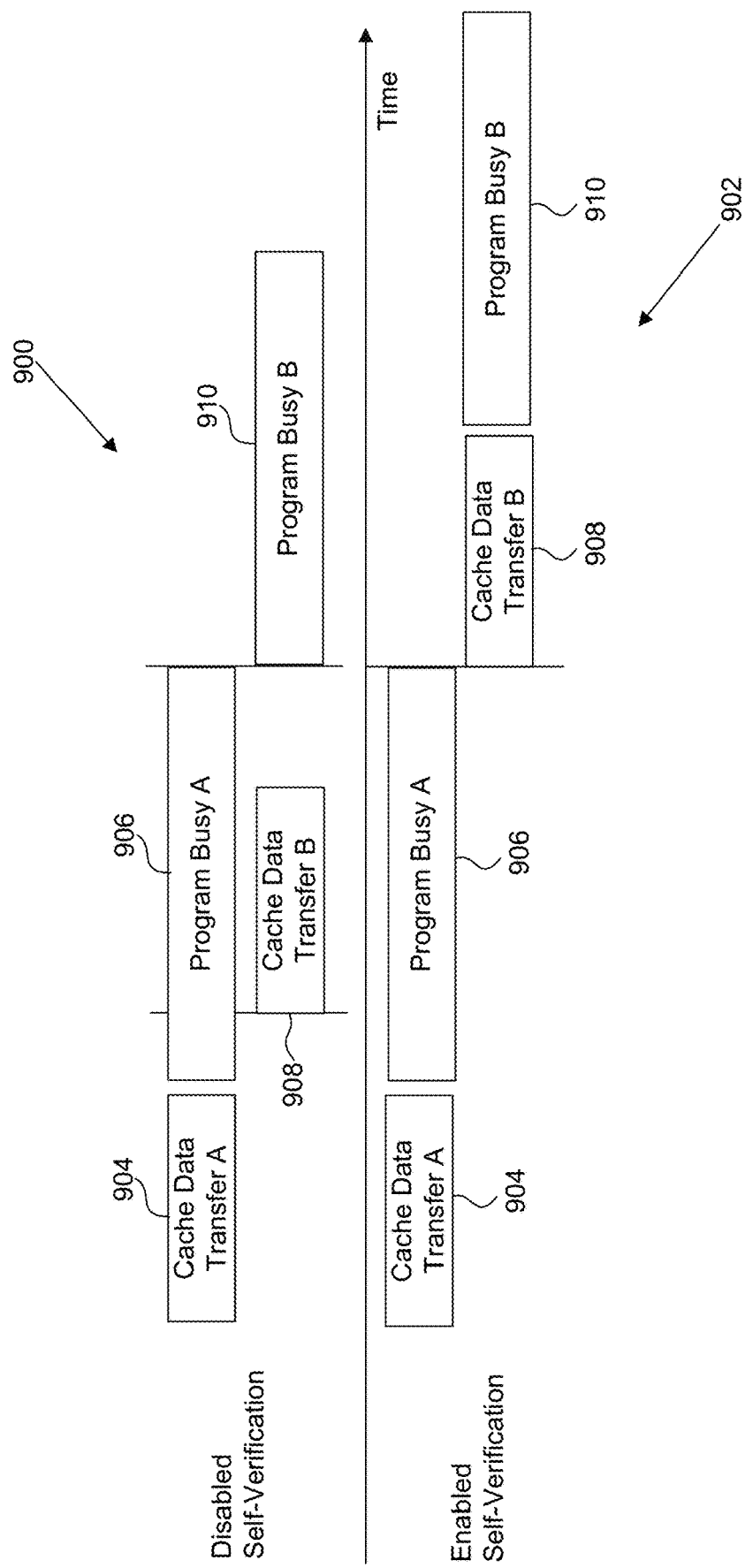
FIG. 9 illustrates timelines for comparing an adjustment performed using NAND firmware.

FIG. 9 shows timelines 900 and 902 for comparing an adjustment performed using NAND firmware, according to some embodiments. In some embodiments, a NAND memory product can have a cache system implementation. The caching system can conflict with the NAND firmware self-verification feature (e.g., read operation of step S870 in FIG. 8). Therefore, it is envisaged that the NAND firmware can adjust operations depending on whether caching is implemented in the NAND memory. The adjustments to the NAND operations can be controlled by user input or by an automatic process in the NAND firmware.

In some embodiments, timeline 900 shows a creation of a cache data transfer A 904 in a cache region of a NAND memory. Cache data transfer A is then used by a program A, which is represented in timeline 900 as program busy A 906. Program busy A 906 can be, for example, operations to program memory cells of a page in the NAND memory (e.g., according to process flow 800 (FIG. 8). During program busy A 906, another cache data transfer 908 can be prepared for a future execution of a program B, which is represented in timeline 900 as program busy B 910. The preparation of cache data transfer B 908 allows immediate execution of program B once program busy A 906 is concluded. A problem is that the creation of cache data transfer B 908 can overwrite the existing cache data transfer A 904. After all, cache storage is designed to be small for quick and temporary storage. Then, it can be that program busy A 906 attempts to execute the self-verify step S870 (FIG. 8), only to find that the cache has been claimed for program B. It is noted that the cached data can be used as a basis for comparison when performing the page read at step S870 (FIG. 8).

Therefore, in some embodiments, the NAND firmware can adjust operations so as to operate as shown in timeline 902 when the NAND memory employs a cache. Timelines 900 and 902 are similar in terms of processes executed, however, timeline 902 moves the creation of cache data transfer B 908 to a timing that is after program buys A 906. It is noted that this is a tradeoff, where the time savings of caching are forfeited in favor of allowing the use of NAND firmware self-verification. By arranging the timing of cache data transfer B 908 in this manner, program busy 906 is free to include step S870 (FIG. 8) without risk of finding an overwritten cache. In some embodiments, the NAND firmware can adjust the timing. For example, the NAND firmware can be configured to detect the use of caching and then perform the delaying of the creation of cache data transfer B 908 based on the detection.

It was mentioned earlier that, in some embodiments, the NAND firmware implementation of step S870 (FIG. 8) allows self-verification to be performed quickly at early stages of a data storing operation. This capability can be used to improve debugging processes, for example, to fix issues relating to double programming.

FIG. 10 illustrates a process flow 1000 for programming pages of a NAND memory, according to some embodiments. Specifically, FIG. 10 illustrates three snapshots of a portion of the NAND memory in which a double program event occurs. The example scenario of FIG. 10 should be understood to be non-limiting (e.g., a program can write to more or fewer than 6 pages of the NAND memory, there can be other ways of arriving at a double program error, etc.). At step S1002, a first set of instructions can be executed by one or more computing devices (e.g., host computer 15 (FIG. 1)). The first set of instructions can include instructions to store data to a page of a NAND memory according to first programming data. In the example illustrated in FIG. 10, the first set of instructions has effected memory controller 20 (FIG. 1) to store data in Pg0-Pg6 according to the first programming data (denoted as Pg0 pgm-Pg6 pgm). Also shown at step S1002 is the address at which a next storing event is to begin. It is denoted by the next program pointer 1008, which points to Pg7 (Pg7 and onward are in erase states ("ers"), ready to receive programming data).

In some embodiments, at step S1004. a second set of instructions can be executed by the one or more computing devices. The second set of instructions can include instructions to store data to a page of a NAND memory according to second programming data. However, due to an error in coding the data storing operations, the program pointer is mis-addressed to Pg4, which stored data corresponding to the first programming data. This event can be referred to as a double programming event. The mis-addressing is denoted by wrong program pointer 1008', and the corresponding overwritten page is denoted as Pg4 double program 1010.

In some embodiments, the data stored in Pg4 is not used by the one or more computing devices until a later time (e.g., a few minutes later, a few days later, or the like). At step S1006, the one or more computing devices execute operations that read back the data from Pg4 of the NAND memory. The read fails due to uncorrectable error correction code present in Pg4. There is a high likelihood that the data at Pg4 is corrupt by this point in time, representing neither of the first or the second programming data. This can occur because, as explained above, memory cells receiving ER states get skipped. For example, memory cells having states {ER P1 ER P1} that are improperly overwritten with second programming data {P1 ER P1 ER}, can result in the memory cells actually storing {P1 P1 P1 P1}. The skipping of the ER states causes the P1 states of the first and second programming data to combine, resulting in corruption of the stored data (useless data that does not represent either of the first or second programming data).

In some embodiments, to correct a mis-addressing error, such as ones described in reference to FIG. 10, a developer can implement debugging measures to determine the cause of the error. Once the cause of the error is determined, appropriate corrections can be made to the instruction code. It is emphasized again that the data stored in Pg4 may not be read from until, perhaps, days later. This can present a large hindrance to debugging efforts, since the discovery of the mis-addressing can occur much later. Numerous operations can take place in the time between a double programming event and the subsequent read fail. Since the developer does not have the benefit of retrospection, the developer has not much choice but to suspect all operations as being possibly at fault. Then, the developer can set up tests for each operation to rule out operations that are working nominally. It is to be appreciated that this can be a cumbersome process if the number of tests to perform are in the hundreds or thousands. In order to reduce this burden, the debugging process can be enhanced by implementing NAND self-verification embodiments disclosed herein.

Figure 11:
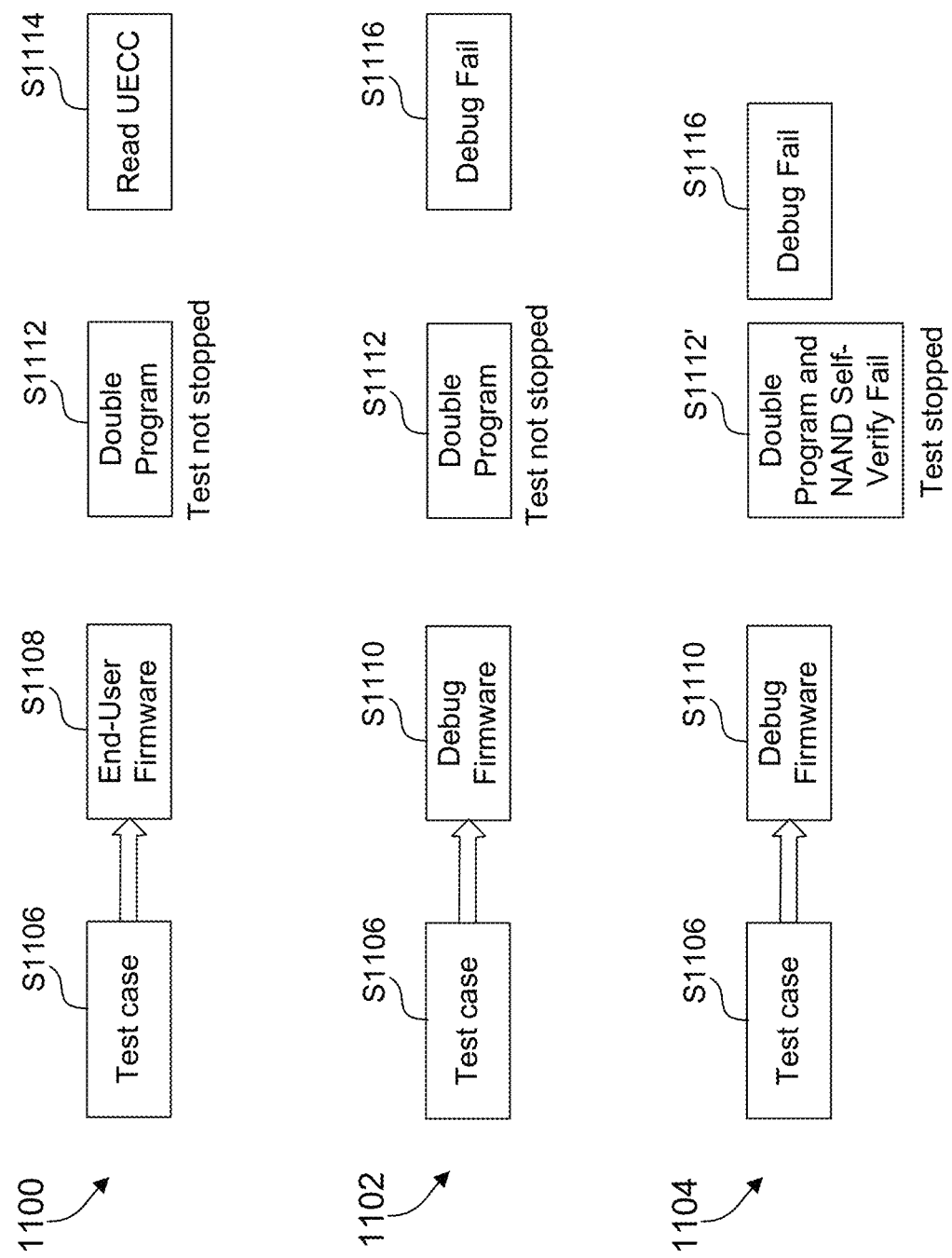
FIG. 11 illustrates process flows that include double programming events, according to some embodiments.

FIG. 11 illustrates process flows 1100, 1102, and 1104 that include double programming events, according to some embodiments. By comparing differences in each process flow, it shall be apparent that the NAND self-verification method in embodiments herein can significantly enhance debugging processes by detecting errors immediately after the error occurs. In some embodiments, a program being executed by one or more computing devices has encountered a UECC memory. The source of the error is unknown—e.g., it could have been a flaw in the code when reading data from a NAND of the executed program, a flaw in the logic of the one or more computing devices, an error in NAND memory, a flaw in the NAND firmware code, or the like. To ascertain the cause of the UECC, a developer can prepare a test case (e.g., a simulation). The test case can include execution of the program that encountered the UECC, but under specific constraints imposed by the developer (e.g., test case parameters).

In some embodiments, flow process 1100 can include steps S1106, S1108, S1112, and S1114. At step 1106, the test case is executed. At step S1108, the test case can interact with end-user firmware (e.g., firmware intended for consumer use) to store data in the NAND memory, for example, using process flow 700 (FIG. 7). End-user firmware can include, for example, firmware in host 15 (FIG. 1) and/or firmware in the NAND memory. In the context of process flow 1100, it is to be appreciated that the NAND firmware does not implement NAND self-verification (e.g., it is either disabled or not present). At step S1112, a double program write occurs in a page of the NAND memory (e.g., Pg4 double program 1010 (FIG. 10)). At step S1114—which can be a few minutes later, a few days later, or more—an UECC read is encountered as a result of the double programming. In this scenario, a developer of the program has gained almost no additional information as to how the UECC is occurring, other than being made aware that the test constraints are capable of producing the UECC read at step S1114. The possible suspects for the error can be any of the operations executed by the program and firmware(s) in the time between steps S1106 to S1114. The double programming event at step S1112 is unknown to the developer and the goal of this exercise is to discover it.

In some embodiments, the developer can implement process flow 1102, which has some enhancements over process flow 1100. Process flow 1102 can include steps S1106, S1110, S1112, and S1116. Step 1106 can be as previously described. A difference now is that, at step 1110, the test case is allowed to interact with debug firmware (e.g. provided by the developer). The debug firmware is a stop gap measure to attempt to stop computer operations closer to whatever it may be that is causing the UECC read. The debug firmware can include, for example, instructions to read certain outputs of processes in the test case and then to cease the running of the test case when an anomaly is found in one of the outputs. However, at step S1112, a double program error occurs but verification of the written data is not performed for a while longer. At step S1116, the debug processes detect an anomaly and return a fail result, stopping the test case. In this scenario, the debug process implemented by the developer is better designed to rule out possible causes of error by detecting anomalies earlier than the UECC read event in step S1114 of process flow 1100. However, the debugging process can be further enhanced by implementing NAND self-verification embodiments disclosed herein, as in process flow 1104.

In some embodiments, yet another issue in using debug firmware is that it can add significant runtime and overhead. For example, the debug firmware can be setup to introduce a redundant next program pointer that for tracking next program pointer 1008 (FIG. 10). The redundant program pointer can be setup point to a dummy layer or deep layer. The redundant program pointer and next program pointer 1008 can be compared to determine a match or if data corruption has occurred. This process can add significant amount of debug code and a much time to get to the failure point. This leads to high overhead because there is more firmware code to check the logic to see whether the NAND sequence is at fault. This solution can potentially change much of the firmware. The firmware can be viewed as a pipeline. Every time a comparison of the redundant program pointer is executed, the pipeline is paused, which can add significant amount of time.

In some embodiments, process flow 1104 can include steps S1106, S1110, S1112', and S1116. Steps 1106 and S1110 can be as previously described. A difference in process flow 1104 is that self-verification via the NAND firmware is enabled (e.g., the read step of S870 (FIG. 8) has been enabled). In some embodiments, step S870 (FIG. 8) can be in a disabled state so as to improve system performance, but can be enabled when needed. For example, the debug firmware can include instructions to the NAND firmware to turn on the NAND self-verification feature. At step S1112', a double program error occurs. Contrasting with the previously presented process flows, process flow 1104 can detect the double programmed page at the read back step. The read back fails and the NAND self-verification process issues a fail indication—the data in a specific page of the NAND memory has an error. This indication can be used to stop the test scenario and the debug process at a point in time that is close to the double program event. This information is valuable for quickly identifying which part of the code is responsible for the double programming error. That is, the debugging that ensues can be based on a timing of the stopping of the program. Furthermore, unlike the redundant program pointer scenario described above (which adds significant time and overhead), using step S870 (FIG. 8) does not implement such extensive changing of firmware operations and the timing impact is less severe. Step S870 is a swift page read using the NAND memory's internal capabilities.

A double programming event and subsequent detection method can be described in the following manner. In some embodiments, a selected page of a NAND flash memory device can be programmed according to first programming data. Then, the selected page can be programmed according to second programming data. The selected page can include memory cells (e.g., page 432 (FIG. 4)) corresponding to a word line. The programming of the selected page can include a plurality of programming operations using a plurality of programming voltages (e.g., step S710 (FIG. 7) or S810 (FIG. 8)). The programming of the selected page can also include a plurality of verifying operations. Ones of the plurality of verifying operations can be performed after corresponding ones of the plurality of programming operations to determine whether programmed memory cells of the plurality of memory cells have threshold voltage levels according to the first or second programming data (e.g., step S720 (FIG. 7) or S820 (FIG. 8)).

Then, in some embodiments, a self-verification can be performed on the selected page using firmware associated with the NAND memory to determine whether the stored first was overwritten (or if the second data was overwritten if the instructions are executed in a different order). The method can include issuing a fail indication upon determining that data stored at the selected page was overwritten. The self-verification can include performing an internal read operation (e.g., step S870 (FIG. 8)) on the selected page, by the NAND flash memory device, to determine the data stored at the selected page.

It should be appreciated that, in some embodiments, the functions described in reference to FIG. 11 can also incorporate features described in reference to other figures. For example, an input to adjust the performing of the read operation (e.g., enable step S870 (FIG. 8)) can be supplied as to the debug firmware and/or the NAND firmware. In another example, if the NAND memory has a caching system, then the NAND self-verification can be configured to interact with the caching features as described previously in reference to FIG. 9. In yet another example, the input can also be used to limit areas of the NAND memory for which NAND self-verification will be used, as described in reference to FIG. 8.

Figure 12:
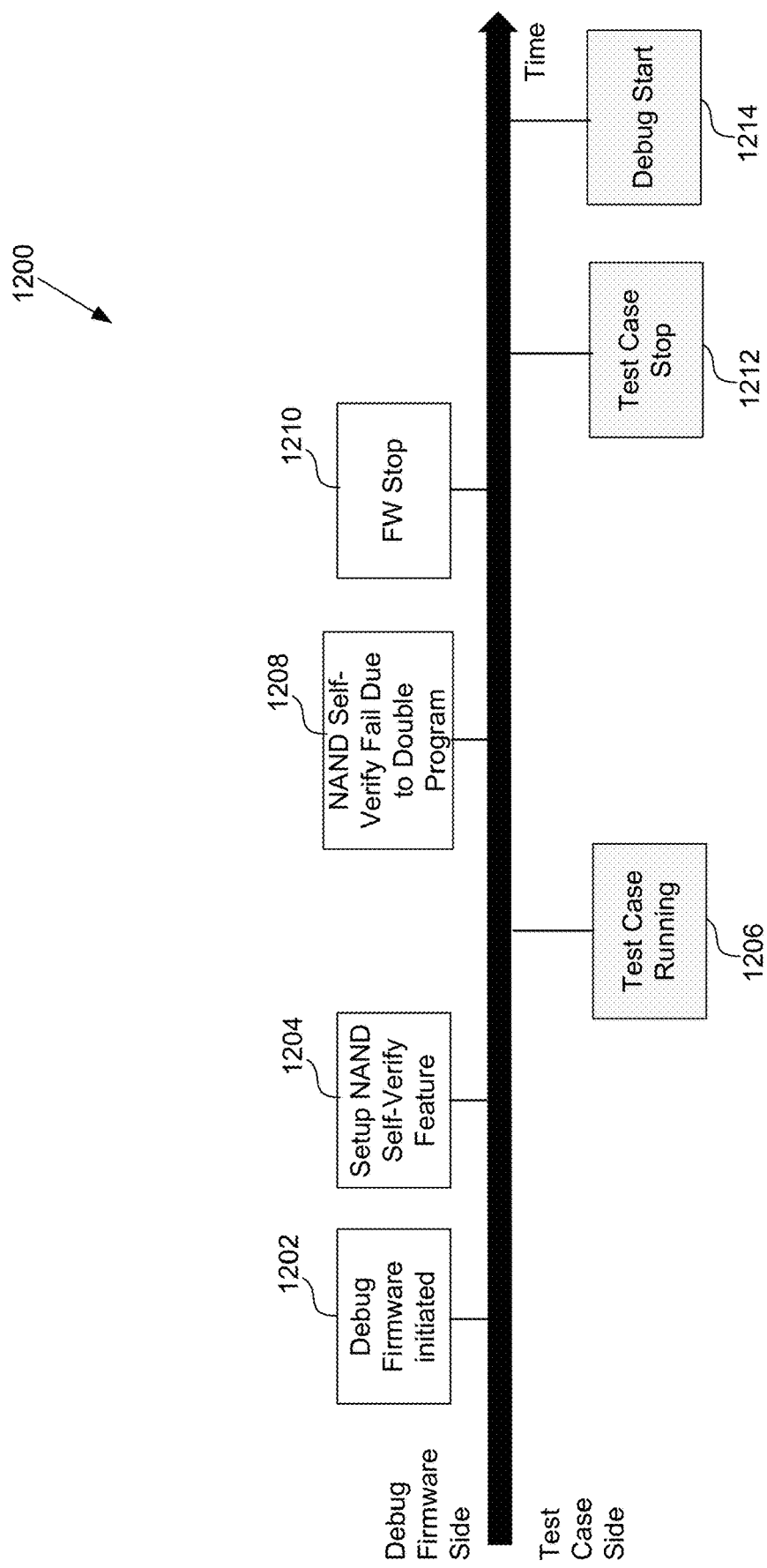
FIG. 12 illustrates a timeline of debugging a double programming event, according to some embodiments.

FIG. 12 illustrates a timeline 1200 of debugging a double programming event, according to some embodiments. In some embodiments, the upper side of timeline 1200 represents events relating to debug firmware. The lower side of timeline 1200 represents events relating to a test case of a program. The debug firmware and test case can implement one or more of the features described previously in reference to FIG. 11.

In some embodiments, debug firmware is initiated at time 1202. At time 1204, the debug firmware sends an input to the firmware of a NAND memory to enable NAND self-verification as described previously in reference to FIGS. 8, 9, and/or 11. At time 1206, a test case of a program can be running. It is envisaged that the test case is initiated at this point in time or the test case is initiated previously and continues to run at time 1206, based on requirements of the test case. At time 1208, the NAND self-verification feature determines a failure due to a double program event. At time 1210, the debug firmware and/or the NAND firmware is instructed to stop. At time 1212, the test case is stopped. At time 1214, the debug starts. Since the test case and firmware have been stopped immediately after the double program event, the debugging steps can be significantly simplified since it will be easier to identify the piece of code that has caused the double programming event to occur.

In some embodiments, the debugging can be executed by one or more computing devices (e.g., host 15 (FIG. 1).

In some embodiments, the NAND self-verification feature disclosed herein can be implemented in methods involving data backup for protecting against data corruption. One example of a data backup scheme can include a RAID arrangement of storage drives (e.g., using physical drives, logical drives, or a combination thereof). The storage drives can comprise one or more NAND memory devices. The RAID arrangement can rely on a so-called parity bit at the end of each block for which protection is sought. Typically, RAID arrangements rely on controller hardware support to instruct the linked storage drives to operate in a redundant arrangement. The additional controller hardware support can result in additional RAM and die size costs. Furthermore, the amount of protection offered per parity group can be limited (e.g., one data error per parity group).

In some embodiment, an alternative to a RAID arrangement for protecting data in NAND memory can be to implement a so-called SLC backup.

Figure 13:
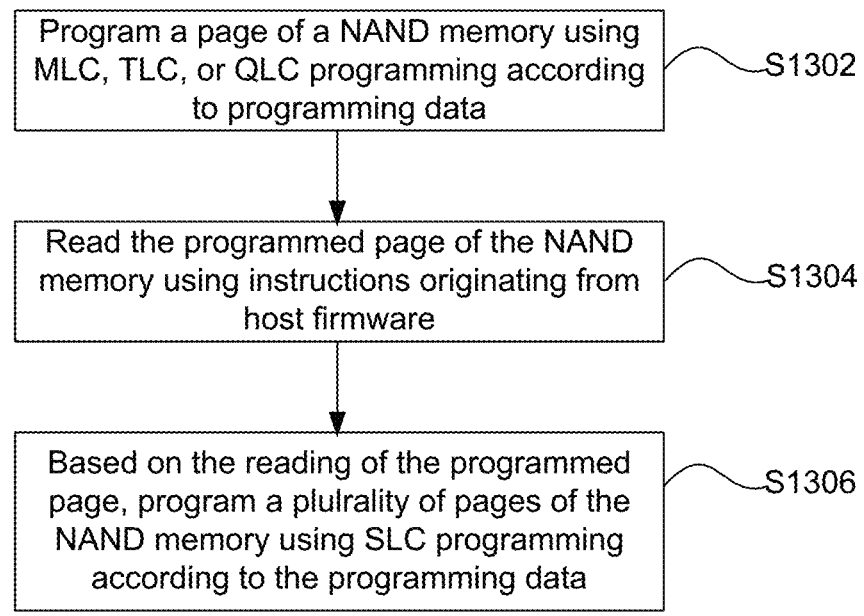
FIG. 13 illustrates a method for performing SLC backup, according to some embodiments.

FIG. 13 illustrates a process flow 1300 for performing SLC backup, according to some embodiments. In some embodiments, a standard MLC, TLC, or QLC program is to be executed on a NAND memory. It is suspected that, in parts of the NAND memory, certain memory cells used for MLC, TLC, or QLC programming have an inherent associated risk (e.g., there is a probability that one or more memory cells may not correctly receive programming). Since SLC programming can be more reliable than MLC, TLC, or QLC programming, a redundant SLC programming is to be executed along with the original MLC, TLC, or QLC programming.

In some embodiments, programming data is provided for storing in a NAND memory. At step S1302, a page of the NAND memory is programmed using MLC, TLC, or QLC programming (e.g., using steps in process flow 700 (FIG. 7)) according to programming data. At step S1304, the MLC, TLC, or QLC programmed page is read back from the NAND memory using one or more computing devices (e.g., host computer 15 (FIG. 1). It is noted that a host firmware can be issuing the instructions to read from the NAND memory, as opposed to originating the page-read instructions from firmware 21 (FIG. 1) of the NAND memory. At step S1306, the MLC, TLC, or QLC programming can also be programmed in an appropriate number of SLC pages in the NAND memory (e.g., TLC programming data can be written to three SLC pages). The programming data saved to SLC regions of the NAND memory can provide reliable backup for data in less reliable MLC, TLC, or QLC regions of the NAND memory. However, the time burden associated with process flow 1300 can be undesirable, particularly the time it takes to perform the read back using the host firmware.

The NAND self-verification method disclosed herein can be used to modify the SLC backup scheme and shorten the time burden of performing data backup, thereby improving performance of data protection methods in NAND memory systems. However, before describing backup operations using the NAND self-verification method, it is instructive to first describe a method for identifying unreliable regions in a NAND memory.

Figure 14:
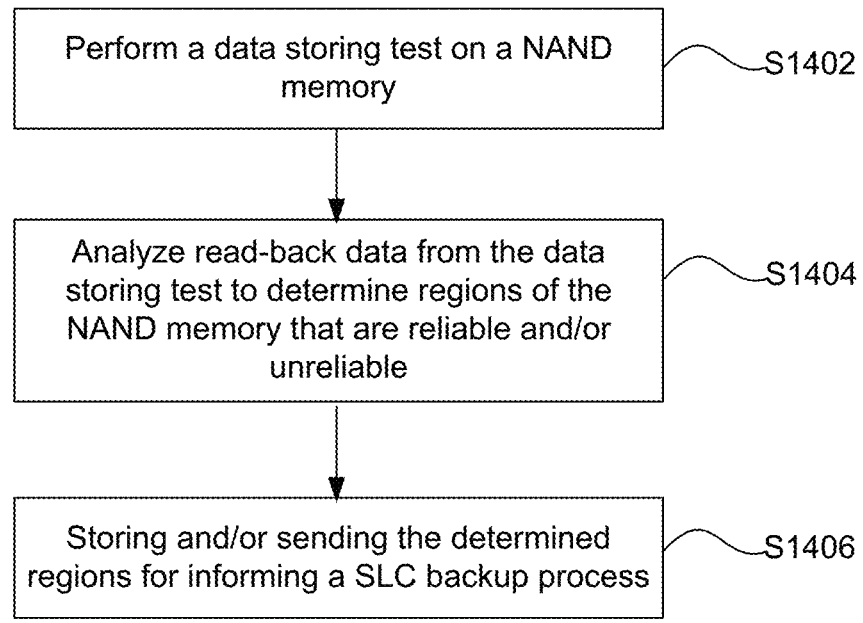
FIG. 14 illustrates a method for identifying unreliable regions in a NAND memory, according to some embodiments.

FIG. 14 illustrates a process flow 1400 for identifying unreliable regions in a NAND memory, according to some embodiments. In some embodiments, it should be appreciated that an unreliable region can refer to a region(s) of the NAND memory that is at risk of failing to program data correctly (e.g., the unreliable region has an associated probability of failure to program data). In one non-limiting example, the risk can be quantified as a threshold probability. A low probability of failure (e.g., below the threshold) can be considered reliable, or vice versa. The threshold probability can be determined, for example, based on the needs of a user or developer of the NAND firmware.

In some embodiments, at step S1402, a data storing test can be performed on the NAND memory. The data storing test can include, for example, storing data in pages of the NAND memory (e.g., using process flow 700 (FIG. 7)). The data storing test can also include reading back stored data from the pages of the NAND memory. At step S1404, analysis can be performed on the data that was read back in step S1402. The analysis can include determining read failure regions in the NAND memory. The analysis can include generating a list of one or more regions that are reliable and/or unreliable. Reliability and/or unreliability can be quantified as described above (e.g., based on probability of failure). At step S1406, the determined regions of reliability/unreliability can be stored in and/or sent to the NAND firmware to inform a subsequent SLC backup process.

Figure 15:
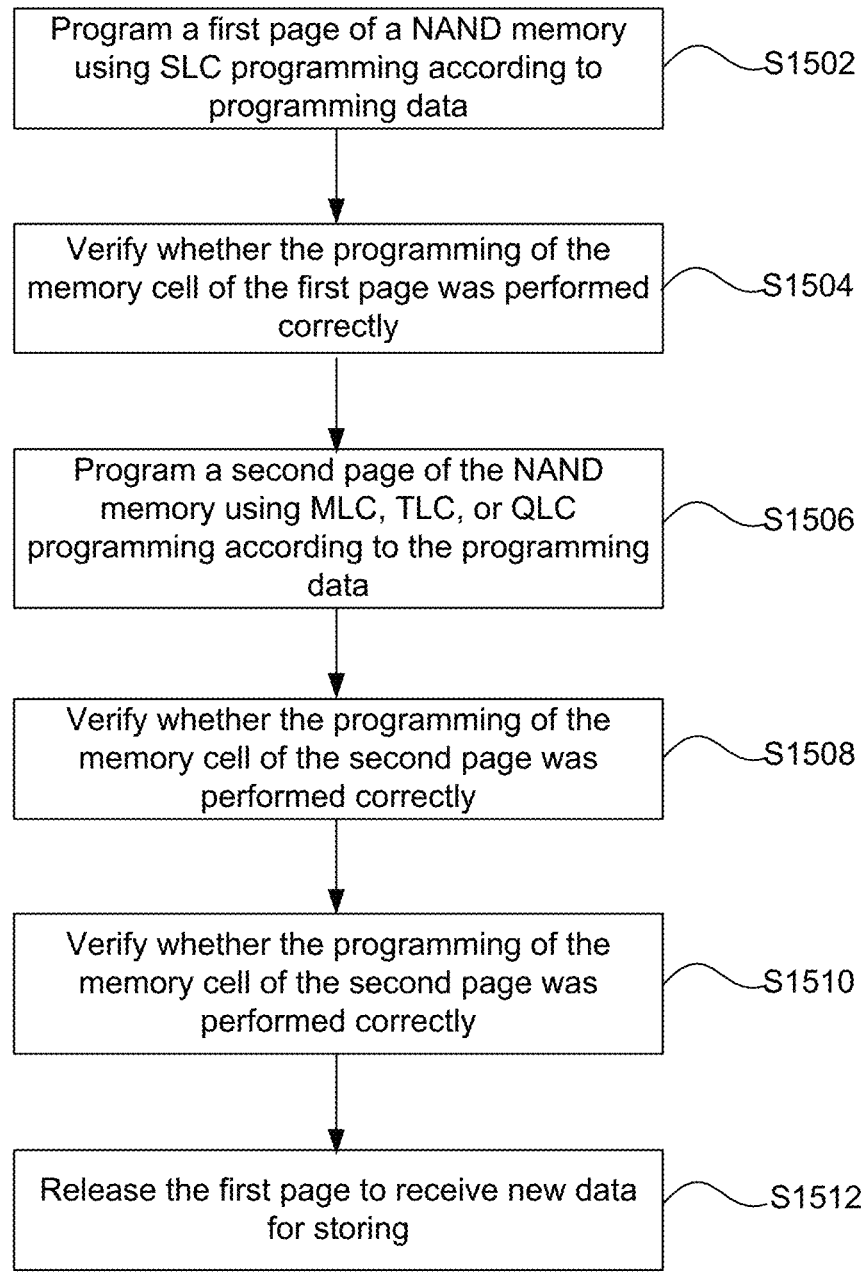
FIGS. 15 and 16 illustrate a method for implementing NAND self-verification in a SLC backup process, according to some embodiments.

FIG. 15 illustrates a process flow 1500 for implementing NAND self-verification in a SLC backup process, according to some embodiments. In some embodiments, programming data is provided for storing in a NAND memory using MLC, TLC, or QLC programming. However, in contrast to process flow 1300 (FIG. 13), regions of the NAND memory identified as being unreliable can follow process flow 1500. The unreliable regions can be determined using, for example, process flow 1400 (FIG. 14). The provided data is stored in pages of the NAND memory according to the programming data.

In some embodiments, at step S1502, a memory cell of a first page of the NAND memory can be programmed according to the programming data (e.g., using steps S710 (FIG. 7) or S810 (FIG. 8)). The programming of the memory cell of the first page of the NAND memory can performed using SLC programming, which can be more reliable than MLC, TLC, or QLC programming.

In some embodiments, at step S1504, verification can be performed to determine whether the programming of the memory cell of the first page was performed correctly (e.g., using steps S720 (FIG. 7) or S820 (FIG. 8)). It is noted that the programming data was originally provided for MLC, TLC, or QLC programming. Therefore, the above-described data storing operations can be performed for an appropriate number of additional pages using SLC programming (e.g., QLC programming data can be written to four SLC pages).

In some embodiments, at step S1506, a memory cell of a second page of the NAND memory can be programmed according to the programming data (e.g., using steps S710 (FIG. 7) or S810 (FIG. 8)). The programming of the memory cell of the second page of the NAND memory can performed using MLC, TLC, or QLC programming. The data stored in the MLC, TLC, or QLC regions of the NAND memory matches the data that was stored in the SLC regions of the NAND memory at step S1502.

In some embodiments, at step S1508, verification can be performed to determine whether the programming of the memory cell of the second page was performed correctly (e.g., using steps S720 (FIG. 7) or S820 (FIG. 8)).

In some embodiments, at step S1510, a read operation can be performed on the second page using firmware associated with the NAND memory to verify the storing of the data in the second page (e.g., NAND self-verification, similar to step S870 (FIG. 8)). Using the NAND internal firmware to verify the programmed second page (i.e., the MLC, TLC, or QLC page(s)), the verification of the programming can be performed significantly faster than performing the verification using host firmware (as was done in step S1304 (FIG. 13)). That is, flow process 1500 does is part of an SLC backup method that includes not performing a read operation on the second page using firmware associated one or more host computing devices configured to execute the SLC backup method, the one or more host computing devices being host to the NAND memory. In other words, the performing of the read operation on the second page using firmware associated with the NAND memory further comprises reducing a time of completion of the backup method compared to performing the read operation on the second page using firmware associated one or more host computing devices. In some examples, the speed of completion can be enhanced by 5% or more, 10% or more, or 15% or more compared to performing the read operation on the second page using firmware associated the one or more host computing devices.

In some embodiments, at step S1512, the first page (SLC region) can be released in preparation to receive new data (i.e., the stored data in the first page can be invalidated and/or erased).

Figure 16:
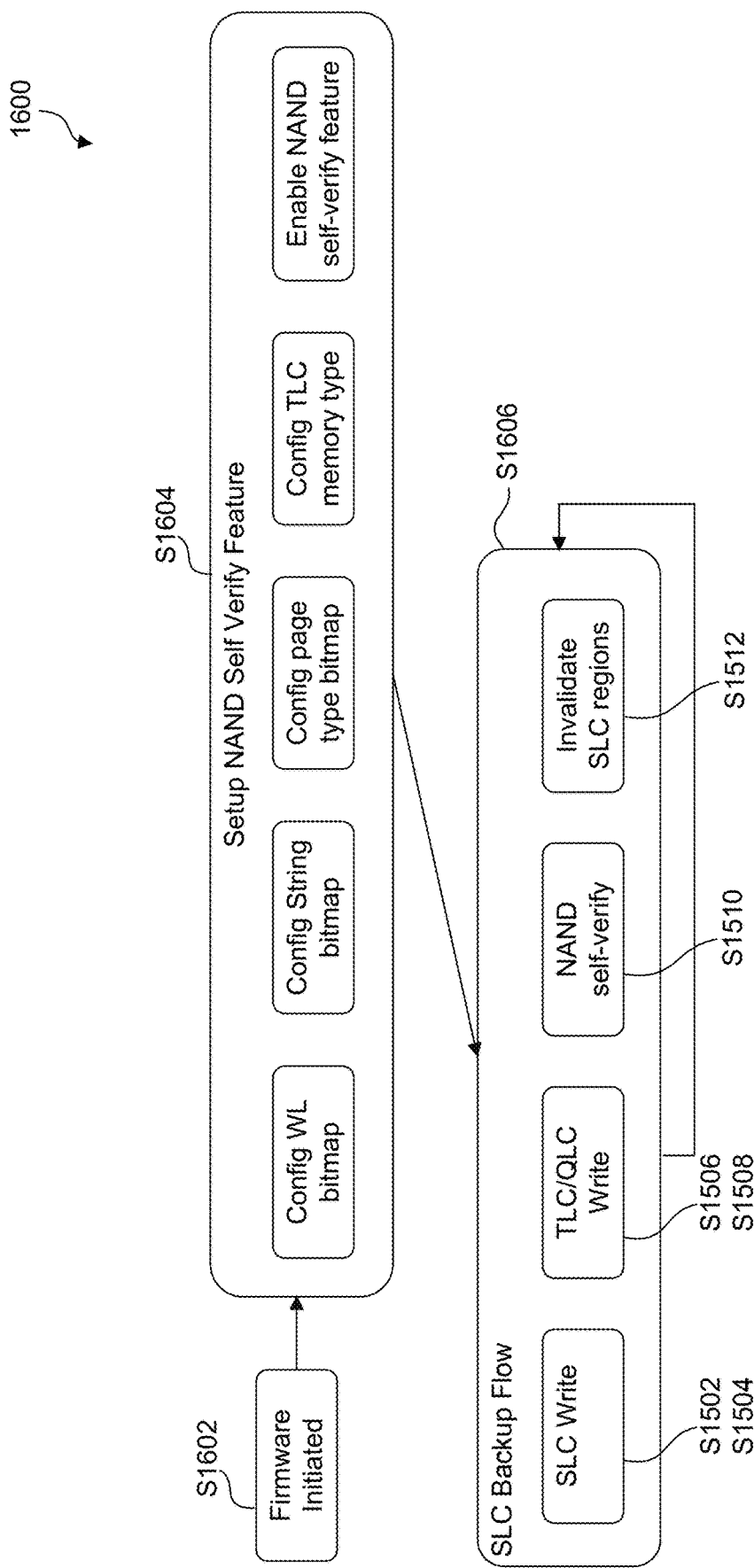

It was described in reference to FIG. 8 that, in some embodiments, an input can be used to adjust the performing of the read operation using the NAND firmware 21 (FIG. 1). Furthermore, it was described in reference to FIG. 14 that one or more regions of reliability/unreliability can be determined, stored, and/or sent to the NAND firmware to inform a subsequent SLC backup process. FIG. 16 illustrates additional details relating to these aspects of FIGS. 8 and 14—the examples being provided in a non-limiting capacity. That is, it is to be appreciated that additional features not explicitly shown in FIG. 8, 14, or 16 are nonetheless envisaged based on embodiments described in reference to other figures.

FIG. 16 illustrates a process flow 1600 for implementing NAND self-verification in a SLC backup process, according to some embodiments. In some embodiments, at step S1602, one or more firmware can be initiated. The one or more firmware can include, for example, firmware 21 (FIG. 1) of a storage system 10 (e.g., a NAND memory) and/or firmware of one or more computing devices that provide enable communication between the NAND memory and the one or more host computing devices. Upon initiation, at step S1604, the NAND self-verification feature in the NAND firmware can be enabled and configured (e.g., enable performing step S870 (FIG. 8)). The enabling of the NAND self-verification feature can be achieved using an input (e.g., as described in reference to time 1204 (FIG. 12)). The input can also include the information of unreliable regions of the NAND memory (e.g., as described in reference to FIG. 14).

In some embodiments, along with enabling of the read operation using firmware associated with the NAND memory, one or more regions of the NAND memory can be selected. The NAND self-verification can be performed on the selected one or more regions. The one or more selected regions can be specified using the input (e.g., unreliable regions). This can significantly improve the speed of the SLC backup process by not performing NAND self-verification on regions that are determined to be reliable (e.g., as described in reference to FIG. 14).

It was described earlier that, in some embodiments, the input can be implemented as a prefix of a user provided command for executing the data storing operations. At step S1604, a number of configurations can take place along with the enabling of the NAND self-verification feature. For example, step S1604 can include configuring a wordline bitmap (to select a wordline or page), configuring a string bitmap (to select a string), configuring a page type bitmap (to select a particular page, e.g., upper page, middle page, lower page), and configuring a memory level type (to select MLC, TLC, or QLC). Selecting a specific location in the NAND memory was described previously in reference to FIG. 8.

In some embodiments, at step S1606, the SLC backup process can be executed on the selected region of the NAND memory that was specified in step S1604. Step S1606 can be achieved by executing process flow 1500 (FIG. 5). Writing to SLC regions of the NAND memory can be achieved using steps S1502 and S1504 (FIG. 15). Writing to MLC, TLC, or QLC regions of the NAND memory can be achieved using steps S1506 and S1508 (FIG. 15). Performing NAND self-verification can be achieved using step S1510 (FIG. 15) or S870 (FIG. 8). Invalidation of unneeded SLC regions can be achieved using step S1512.

The method steps in embodiments disclosed herein can be performed in any conceivable order and it is not required that all steps be performed.

In summary, the present disclosure provides a method of debugging a double program error using NAND self-verification. The programming method can include programming a selected page of the NAND flash memory device according to first and second programming data. The selected page can include a plurality of memory cells corresponding to a word line. The programming of the selected page can include a plurality of programming operations using a plurality of programming voltages. The programming of the selected page can also include a plurality of verifying operations. Ones of the plurality of verifying operations can be performed after corresponding ones of the plurality of programming operations to determine whether programmed memory cells of the selected page have threshold voltage levels according to the first or second programming data. The programming method can also include performing a self-verification on the selected page, by the NAND flash memory device, to determine whether data stored at the selected page was overwritten. The programming method can also include generating a fail indication upon determining that the data stored at the selected page was overwritten.

The present disclosure also provides a NAND flash memory device for debugging a double program error using NAND self-verification. The NAND flash memory device can include a memory array including a plurality of pages. Each of the plurality of pages can include a plurality of memory cells corresponding to a word line. The NAND flash memory device can also include a peripheral circuit coupled to the plurality of pages via the word line. The peripheral circuit can program a selected page of the NAND flash memory device according to first and second programming data. The programming of the selected page can include a plurality of programming operations using a plurality of programming voltages. The programming of the selected page can also include a plurality of verifying operations. Ones of the plurality of verifying operations can be performed after corresponding ones of the plurality of programming operations to determine whether programmed memory cells of the selected page have threshold voltage levels according to the first or second programming data. The peripheral circuit can also perform a self-verification on the selected page to determine whether data stored at the selected page was overwritten. The NAND flash memory device can generate a fail indication upon determining that the data stored at the selected page was overwritten.

The present disclosure further provides a system for debugging a double program error using NAND self-verification. The system can include one or more computing devices and a NAND flash memory device. The NAND flash memory device can include a memory array including a plurality of pages. Each of the plurality of pages can include a plurality of memory cells corresponding to a word line. The NAND flash memory device can also include a peripheral circuit coupled to the plurality of pages via the word line. The peripheral circuit can program a selected page of the NAND flash memory device according to first and second programming data. The programming of the selected page can include a plurality of programming operations using a plurality of programming voltages. The programming of the selected page can also include a plurality of verifying operations. Ones of the plurality of verifying operations can be performed after corresponding ones of the plurality of programming operations to determine whether programmed memory cells of the selected page have threshold voltage levels according to the first or second programming data. The peripheral circuit can also perform a self-verification on the selected page to determine whether data stored at the selected page was overwritten. The NAND flash memory device can generate a fail indication upon determining that data stored at the selected page was overwritten.

The foregoing description of the specific embodiments will so fully reveal the general nature of the present disclosure that others can, by applying knowledge within the skill of the art, readily modify and/or adapt, for various applications, such specific embodiments, without undue experimentation, and without departing from the general concept of the present disclosure. Therefore, such adaptations and modifications are intended to be within the meaning and range of equivalents of the disclosed embodiments, based on the disclosure and guidance presented herein. It is to be understood that the phraseology or terminology herein is for the purpose of description and not of limitation, such that the terminology or phraseology of the present specification is to be interpreted by the skilled artisan in light of the disclosure and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections can set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A programming method for a NAND flash memory device, comprising:
    programming a selected page of the NAND flash memory device according to programming data, wherein the selected page comprises memory cells corresponding to a word line, the programming of the selected page comprising:
        programming operations with programming voltages applied on the word line; and
        a read operation performed on the selected page.

2. The programming method of claim 1, wherein the read operation is performed without a read command sent by a memory controller that is coupled to the NAND flash memory device.

3. The programming method of claim 1, further comprising:
    generating an indication based on a result corresponding to the read operation.

4. The programming method of claim 3, wherein
    the read operation is performed to determine whether the programing data is stored at the selected page; and
    a fail indication is generated in response to the determination that the programing data is not stored at the selected page.

5. The programming method of claim 4, wherein
    the programming of the selected page is associated with a memory controller-implemented program; and
    the fail indication indicates that stopping of the memory controller-implemented program.

6. The programming method of claim 5, wherein the fail indication further indicates that debugging of the memory controller-implemented program.

7. The programming method of claim 1, wherein the programming of the selected page further comprises:
    verifying operations with verifying voltages applied on the word line, wherein the verifying operations are performed after corresponding ones of the programming operations to determine whether programmed memory cells have corresponding threshold voltage levels.

8. The programming method of claim 7, wherein the read operation is performed in response to that a last non-ER state (non-erase state) is programmed in the selected page based on the verifying operations.

9. The programming method of claim 1, wherein the performing of the read operation is limited to one or more regions of the NAND flash memory device, and the one or more regions comprises at least one of:
    a region used for single-level cells (SLC);
    a region used for multi-level cells (MLC);
    a region used for triple-level cells (TLC);
    a region used for quad-level cells (QLC);
    a page;
    a block; or
    a plane.

10. The programming method of claim 3, further comprising:
    delaying a caching of future programming data until after the generating of the indication.

11. A NAND flash memory device comprising:
    a memory array comprising pages, each of the pages comprising memory cells corresponding to a word line; and
    a peripheral circuit coupled to the word line and configured to:

program a selected page of the pages according to programming data, wherein the programming of the selected page comprises:
programming operations with programming voltages applied on the word line; and
a read operation performed on the selected page.

12. The NAND flash memory device of claim 11, wherein the read operation is performed without a read command sent by a memory controller that is coupled to the NAND flash memory device.

13. The NAND flash memory device of claim 11, wherein the read operation is performed to determine whether the programing data is stored at the selected page; and
the peripheral circuit is further configured to generate a fail indication in response to the determination that the programing data is not stored at the selected page.

14. The NAND flash memory device of claim 11, wherein the programming of the selected page further comprises:
verifying operations with verifying voltages applied on the word line, wherein the verifying operations are performed after corresponding ones of the programming operations to determine whether programmed memory cells have corresponding threshold voltage levels.

15. The NAND flash memory device of claim 14, wherein the read operation is performed in response to that a last non-ER state (non-erase state) is programmed in the selected page based on the verifying operations.

16. A memory system comprising:
a memory controller; and
a NAND flash memory device coupled to the memory controller and comprising:
a memory array comprising pages, each of the pages comprising memory cells corresponding to a word line; and
a peripheral circuit coupled to the word line and configured to:
program a selected page of the pages according to programming data, wherein the programming of the selected page comprises:
programming operations with programming voltages applied on the word line; and
a read operation performed on the selected page; and
generate a fail indication upon determining that the programing data is not stored at the selected page according to the read operation.

17. The memory system of claim 16, wherein the read operation is performed without a read command sent by the memory controller.

18. The memory system of claim 16, wherein
the programming of the selected page is associated with a memory controller-implemented program; and
the fail indication indicates that stopping of the memory controller-implemented program.

19. The memory system of claim 18, wherein the fail indication further indicates that debugging of the memory controller-implemented program.

20. The memory system of claim 16, wherein
the programming of the selected page further comprises verifying operations with verifying voltages applied on the word line;
the verifying operations are performed after corresponding ones of the programming operations to determine whether programmed memory cells have corresponding threshold voltage levels; and
the read operation is performed in response to that a last non-ER state (non-erase state) is programmed in the selected page based on the verifying operations.

* * * * *